US012672521B2

(12) United States Patent
Kim et al.

(10) Patent No.: US 12,672,521 B2
(45) Date of Patent: Jun. 30, 2026

(54) METHOD OF FABRICATING A SEMICONDUCTOR DEVICE BASED ON A MEASURED MISALIGNMENT VALUE

(71) Applicant: Samsung Electronics Co., Ltd., Suwon-si (KR)

(72) Inventors: Keunnam Kim, Suwon-si (KR); Kiseok Lee, Suwon-si (KR); Byeongjoo Ku, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 715 days.

(21) Appl. No.: 18/150,324

(22) Filed: Jan. 5, 2023

(65) Prior Publication Data

US 2024/0006250 A1 Jan. 4, 2024

(30) Foreign Application Priority Data

Jun. 30, 2022 (KR) ........................ 10-2022-0080680

(51) Int. Cl.
H10P 74/00 (2026.01)
H10P 50/00 (2026.01)
(Continued)

(52) U.S. Cl.
CPC .............. H10P 74/23 (2026.01); H10P 50/73 (2026.01); H10P 76/2041 (2026.01); H10W 20/057 (2026.01); H10W 20/089 (2026.01)

(58) Field of Classification Search
CPC ................. H01L 22/20; H01L 21/0274; H01L 21/31144; H01L 21/76816; H01L 21/76879; H01L 23/544; H01L 25/16;

H01L 2223/54426; H01L 2223/5448; H01L 22/12; H01L 21/768; H01L 21/76802; H01L 21/76877; G03F 1/00; G03F 7/70525; H10B 69/00; H10B 41/20; H10B 41/27; H10B 41/35; H10B 43/20; H10B 43/27; H10B 43/35; H10P 74/23; H10P 50/73; H10P 76/2041; H10P 74/203; H10W 20/057; H10W 20/089; H10W 46/00; H10W 46/301; H10W 46/603;
(Continued)

(56) References Cited

U.S. PATENT DOCUMENTS 5,243,195 A * 9/1993 Nishi .................... G03F 9/7088
250/548
5,272,501 A * 12/1993 Nishi .................... G03F 9/7049
355/71
(Continued)

FOREIGN PATENT DOCUMENTS

| CN | 112805820 A | 5/2021 |
| KR | 20190029855 A | 3/2019 |
| TW | 200419713 A | 10/2004 |

*Primary Examiner* — Caleb E Henry
(74) *Attorney, Agent, or Firm* — Fish & Richardson P.C.

(57) ABSTRACT

Disclosed is a semiconductor fabrication method comprising forming a first conductive structure and a second conductive structure, measuring a misalignment value between the first conductive structure and the second conductive structure, based on the measured misalignment value selecting a reticle from a set of reticles, and using the selected reticle to form a connection conductive structure that electrically connects the first conductive structure to the second conductive structure.

20 Claims, 32 Drawing Sheets

(51) Int. Cl.
H10P 76/20 (2026.01)
H10W 20/00 (2026.01)

(58) Field of Classification Search
CPC ... H10W 90/00; H10W 20/01; H10W 20/056;
H10W 20/081
See application file for complete search history.

(56) References Cited

U.S. PATENT DOCUMENTS

| | | | |
|---|---|---|---|
| 6,005,295 A * | 12/1999 | Hattori | H01L 23/544 |
| | | | 257/E23.179 |
| 6,251,745 B1 * | 6/2001 | Yu | G03F 7/70633 |
| | | | 257/E21.53 |
| 6,553,276 B2 | 4/2003 | Akram et al. | |
| 8,383,301 B2 * | 2/2013 | Rolfson | G03F 1/32 |
| | | | 430/5 |
| 8,900,885 B1 | 12/2014 | Hubbard et al. | |
| 9,276,011 B2 * | 3/2016 | Simsek-Ege | H10B 41/23 |
| 9,337,209 B1 * | 5/2016 | Chiang | H10D 30/693 |
| 9,379,131 B2 * | 6/2016 | Lai | H10D 30/0413 |
| 9,520,299 B2 * | 12/2016 | Yi | H10P 50/696 |
| 9,646,865 B1 * | 5/2017 | Zhang | H01L 21/68 |
| 10,964,691 B2 | 3/2021 | Colinge et al. | |
| 11,031,374 B2 | 6/2021 | Sukekawa | |
| 2002/0048928 A1 * | 4/2002 | Nakagawa | H01L 21/7682 |
| | | | 257/E21.507 |
| 2003/0211410 A1 * | 11/2003 | Irie | G03F 7/70991 |
| | | | 430/311 |
| 2004/0188842 A1 | 9/2004 | Takewaka et al. | |
| 2011/0140275 A1 | 6/2011 | Noguchi et al. | |
| 2011/0287349 A1 * | 11/2011 | Anderson | G03F 1/26 |
| | | | 430/312 |
| 2013/0052569 A1 * | 2/2013 | Choi | G03F 1/78 |
| | | | 430/5 |
| 2014/0264533 A1 * | 9/2014 | Simsek-Ege | H10D 30/0413 |
| | | | 257/326 |
| 2014/0264823 A1 * | 9/2014 | Hsieh | G03F 7/70475 |
| | | | 430/311 |
| 2014/0332979 A1 | 11/2014 | Cicalo et al. | |
| 2015/0092169 A1 * | 4/2015 | Takenaka | G03F 7/70525 |
| | | | 355/55 |
| 2015/0160073 A1 * | 6/2015 | Otaki | G03F 7/706 |
| | | | 356/520 |
| 2016/0099255 A1 * | 4/2016 | Lai | H10B 43/27 |
| | | | 438/269 |
| 2016/0133638 A1 * | 5/2016 | Simsek-Ege | H10B 43/27 |
| | | | 438/269 |
| 2016/0172207 A1 * | 6/2016 | Kwon | G03F 1/62 |
| | | | 438/479 |
| 2016/0284723 A1 * | 9/2016 | Rabkin | H10D 62/852 |
| 2016/0343728 A1 * | 11/2016 | Song | G11C 16/0483 |
| 2017/0133320 A1 | 5/2017 | Liaw et al. | |
| 2017/0186765 A1 * | 6/2017 | Koval | G11C 16/26 |
| 2018/0096840 A1 * | 4/2018 | Jeong | H10D 86/0231 |
| 2018/0096947 A1 * | 4/2018 | Lee | H10B 12/053 |
| 2018/0175016 A1 * | 6/2018 | Kim | G03F 7/70683 |
| 2018/0267408 A1 * | 9/2018 | Ortner | G03F 7/203 |
| 2019/0067246 A1 * | 2/2019 | Wu | H01L 21/76877 |
| 2019/0081102 A1 | 3/2019 | Park et al. | |
| 2019/0304887 A1 | 10/2019 | Ganesan et al. | |
| 2020/0143010 A1 * | 5/2020 | Lee | G06F 30/398 |
| 2021/0242131 A1 * | 8/2021 | Ong | H01L 23/53266 |
| 2021/0242235 A1 * | 8/2021 | Lee | H10B 43/40 |
| 2021/0257298 A1 * | 8/2021 | Xu | H01L 21/76877 |
| 2021/0358806 A1 * | 11/2021 | Hu | H10B 41/27 |
| 2021/0358890 A1 * | 11/2021 | Hu | H10B 43/35 |
| 2021/0398987 A1 * | 12/2021 | Hopkins | H10B 69/00 |
| 2022/0013534 A1 * | 1/2022 | Chandolu | H10B 43/10 |
| 2022/0068962 A1 | 3/2022 | Lee | |
| 2022/0109002 A1 * | 4/2022 | Gupta | H01L 21/76897 |
| 2022/0199641 A1 * | 6/2022 | Fukuzumi | H10B 41/10 |
| 2022/0359381 A1 * | 11/2022 | Li | H01L 21/76846 |
| 2023/0380193 A1 * | 11/2023 | Daycock | H10N 70/026 |

* cited by examiner

| Forming first conductive structure and second conductive structure | ~S10 |

| Forming connection conductive structure that electrically connects first conductive structure to second conductive structure | ~S20 |

METHOD OF FABRICATING A SEMICONDUCTOR DEVICE BASED ON A MEASURED MISALIGNMENT VALUE

CROSS-REFERENCE TO RELATED APPLICATION

This U.S. nonprovisional application claims priority under 35 U.S.C § 119 to Korean Patent Application No. 10-2022-0080680 filed on Jun. 30, 2022 in the Korean Intellectual Property Office, the disclosure of which is hereby incorporated by reference in its entirety.

BACKGROUND

Various example embodiments relate to a method of fabricating a semiconductor device, and more particularly, to a method of fabricating a semiconductor device including the formation of a connection conductive structure.

A semiconductor device includes an integrated circuit having metal oxide semiconductor field effect transistors (MOSFETs). As sizes and/or design rules of the semiconductor device are gradually decreased, sizes of the MOSFETs are also increasingly scaled down. The scale down of MOSFETs may deteriorate operating characteristics of the semiconductor device. Accordingly, research has been variously developed to manufacture the semiconductor device having improved or excellent performances while overcoming or improving over limitations due to integration of the semiconductor device.

SUMMARY

Various example embodiments provide a method of fabricating a semiconductor device whose electrical properties are improved.

According to various example embodiments, a method of fabricating a semiconductor device may comprise: forming a first conductive structure and a second conductive structure; measuring a misalignment value between the first conductive structure and the second conductive structure; based on the measured misalignment value, selecting a reticle from a set of reticles; and using the selected reticle to form a connection conductive structure that electrically connects the first conductive structure to the second conductive structure.

According to various example embodiments, a method of fabricating a semiconductor device may comprise: forming a first conductive structure and a second conductive structure, the first conductive structure including a main conductive structure and a preliminary conductive structure; measuring a misalignment value between the first conductive structure and the second conductive structure; determining whether the measured misalignment value is less than a threshold value; in response to the measured misalignment value being less than the threshold value, forming a connection conductive structure to electrically connect the main conductive structure to the second conductive structure; and in response to the measured misalignment value being greater than or equal to the threshold value, forming the connection conductive structure to electrically connect the preliminary conductive structure to the second conductive structure.

According to various example embodiments, a method of fabricating a semiconductor device may comprise: forming a first conductive structure and a second conductive structure; and forming a connection conductive structure to align with a position of the first conductive structure. The connection conductive structure may electrically connect the first conductive structure to the second conductive structure. The first conductive structure may include a first adjacent sidewall adjacent to the second conductive structure. The second conductive structure may include a second adjacent sidewall adjacent to the first conductive structure. The connection conductive structure may include a first portion that overlaps the first conductive structure and a second portion that overlaps the second conductive structure. The first portion of the connection conductive structure may include a first outer sidewall that is farthest from the second portion of the connection conductive structure. The second portion of the connection conductive structure may include a second outer sidewall that is farthest from the first portion of the connection conductive structure. A distance between the first adjacent sidewall of the first conductive structure and the first outer sidewall of the first portion of the connection conductive structure may be less than a distance between the second adjacent sidewall of the second conductive structure and the second outer sidewall of the second portion of the connection conductive structure.

BRIEF DESCRIPTION OF THE DRAWINGS

FIG. 8A illustrates a plan view showing a connection conductive structure formed according to some example embodiments.

FIG. 9A illustrates a plan view showing a connection conductive structure formed according to some example embodiments.

FIG. 12B illustrates a cross-sectional view taken along line A3-A3' of FIG. 12A.

FIGS. 13A, 13B, 14A, 14B, 15A, 15B, 16, 17, and 18 illustrate diagrams showing a method of fabricating a semiconductor device according to some example embodiments.

DETAIL PARTED DESCRIPTION OF EXAMPLE EMBODIMENTS

Figure 1:
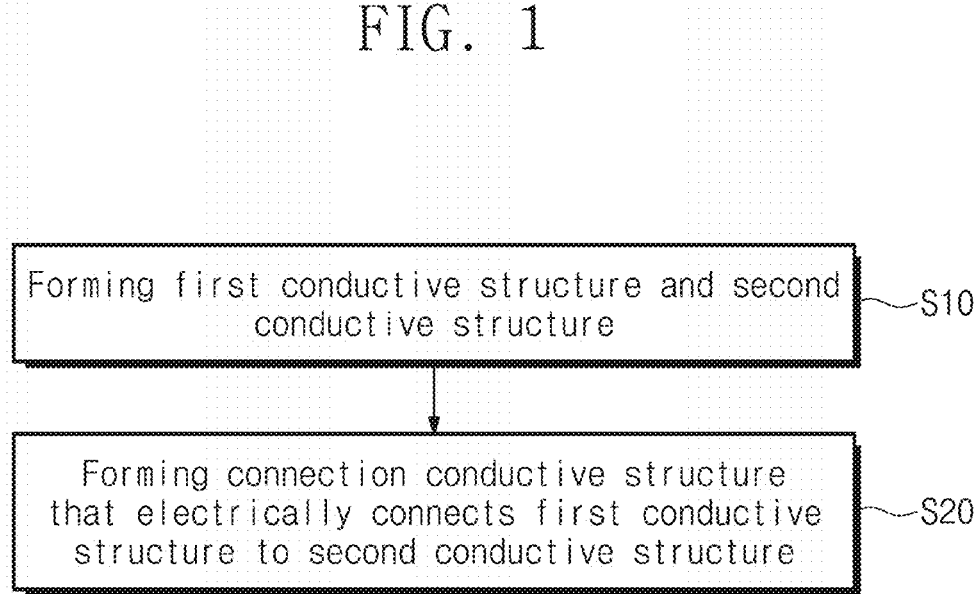
FIG. 1 illustrates a flow chart showing a method of fabricating a semiconductor device according to some example embodiments.

FIG. 1 illustrates a flow chart showing a method of fabricating a semiconductor device according to some example embodiments. FIGS. 2A, 2B, 2C, and 2D illustrate cross-sectional views showing a method of fabricating a semiconductor device according to some example embodiments.

Referring to FIG. 1, a method of fabricating a semiconductor device according to some example embodiments may include a step S10 of forming a first conductive structure and a second conductive structure and a step S20 of forming a connection conductive structure that electrically connects the first conductive structure to the second conductive structure.

Figure 2A:
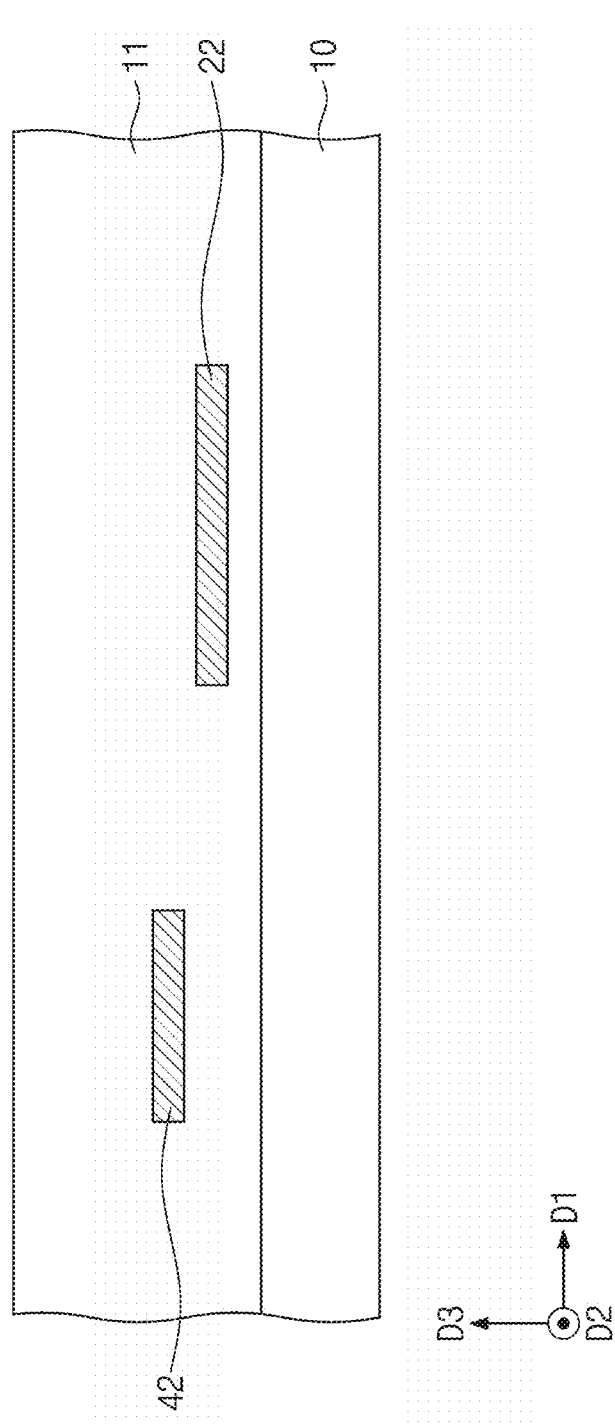
FIGS. 2A, 2B, 2C, and 2D illustrate cross-sectional views showing a method of fabricating a semiconductor device according to some example embodiments.

Referring to FIGS. 1 and 2A, a dielectric structure 11 may be formed on a substrate 10. The substrate 10 may have a plate shape that extends along a plane defined in a first direction D1 and a second direction D2. The first and second directions D1 and D2 may intersect each other. For example, the first and second directions D1 and D2 may be horizontal directions that are orthogonal to each other. In some example embodiments, the substrate 10 may be or may include a semiconductor substrate. For example, the substrate 10 may include silicon, germanium, silicon-germanium, GaP, or GaAs. In some example embodiments, the substrate 10 may be or may include a silicon-on-insulator (SOI) substrate or a germanium-on-insulator (GOI) substrate. In some example embodiments, the substrate 10 may be a wafer; however, example embodiments are not limited thereto.

The dielectric structure 11 may include a dielectric material. In some example embodiments, the dielectric structure 11 may include a plurality of dielectric layers.

A first conductive structure 22 and a second conductive structure 42 may be formed in the dielectric structure 11. The first conductive structure 22 may include a conductive material. In some example embodiments, the first conductive structure 22 may include a plurality of first conductive structures that are arranged in the second direction D2. The first conductive structure 22 may be a conductive line that extends in the first direction D1. In some example embodiments, the first conductive structure 22 may be or may include a conductive contact.

The second conductive structure 42 may include a conductive material. In some example embodiments, the second conductive structure 42 may include a plurality of second conductive structures that are arranged in the second direction D2. The second conductive structure 42 may be a conductive line that extends in the first direction D1. In some example embodiments, the second conductive structure 42 may be a conductive contact, such as a conductive local interconnect or conductive local runner.

An electronic element may be provided in the dielectric structure 11 and/or between the dielectric structure 11 and the substrate 10. For example, the electronic element may include at least one selected from transistors, capacitors, resistors, and diodes. The electronic element may be a passive electronic element or an active electronic element; example embodiments are not limited thereto. The electronic element may be electrically connected to at least one selected from the first conductive structure 22 and the second conductive structure 42.

Figure 2B:
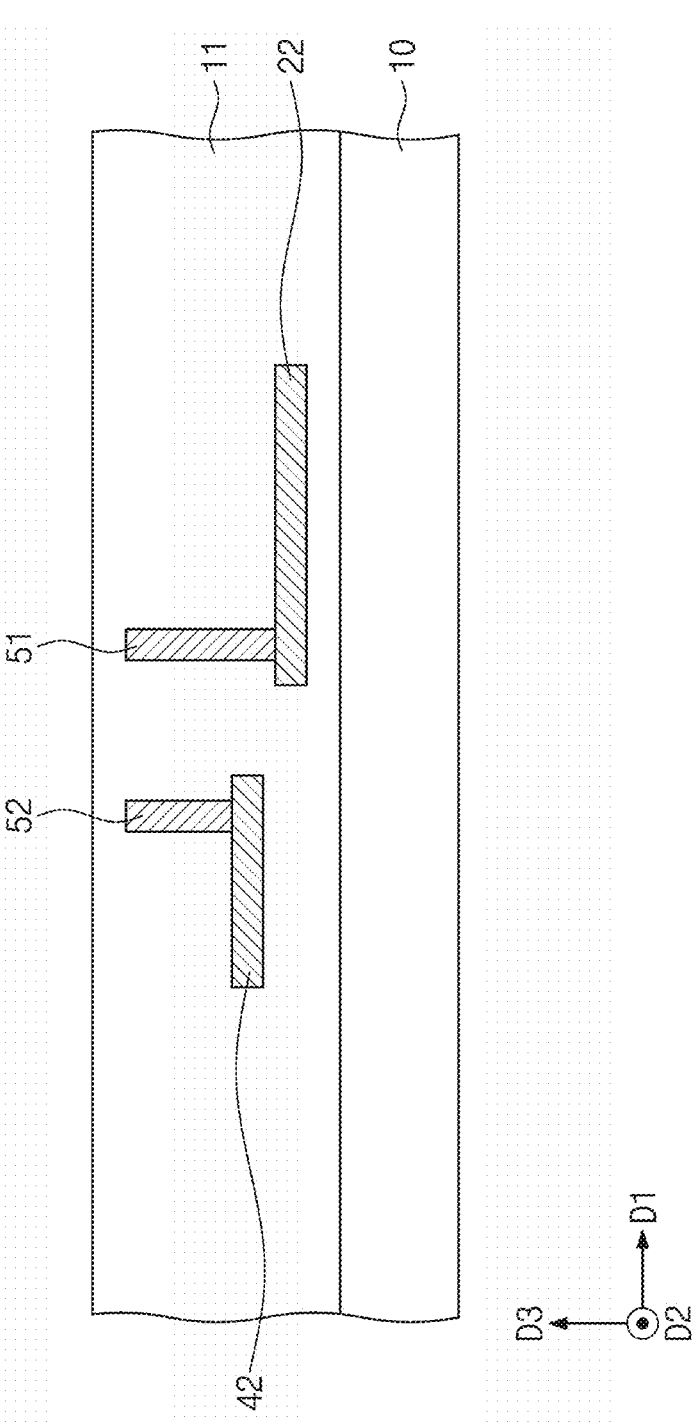

Referring to FIG. 2B, there may be formed a first conductive contact 51 and a second conductive contact 52. The first conductive contact 51 may extend in a third direction D3 to come into connection with the first conductive structure 22, for example to a bottom of the first conductive structure 22. In some example embodiments, the first conductive contact 51 may include a plurality of first conductive contacts, and the plurality of first conductive contacts 51 may be correspondingly connected to the plurality of first conductive structures 22. The second conductive contact 52 may extend in the third direction D3 to come into connection with the second conductive structure 42, for example to a bottom of the second conductive structure 42. In some example embodiments, the second conductive contact 52 may include a plurality of second conductive contacts, and the plurality of second conductive contacts 52 may be correspondingly connected to the plurality of second conductive structures 42. The first and second conductive contacts 51 and 52 may include a conductive material, and may or may not include the same material.

After the formation of the first and second conductive contacts 51 and 52, a portion of the dielectric structure 11 may further be formed to cover the first and second conductive contacts 51 and 52. In some example embodiments, the first and second conductive contacts 51 and 52 may be formed simultaneously with each other. In some example embodiments, the first and second conductive contacts 51 and 52 may be formed by separate processes.

Figure 2C:
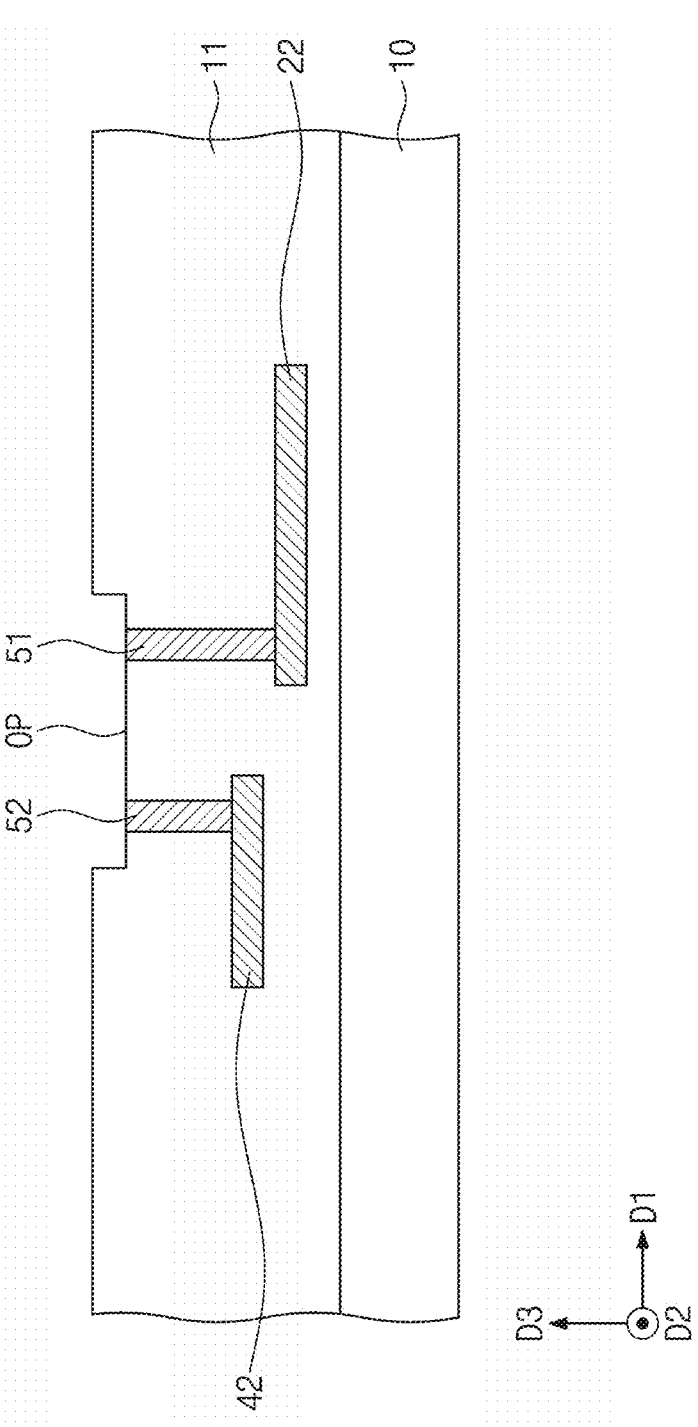

Referring to FIG. 2C, a connection opening OP may be formed. The formation of the connection opening OP may include performing a or at least one photolithography process and performing a or at least one process that etches the dielectric structure 11.

In some example embodiments, the performing of the photolithography process may include forming a photoresist layer on the dielectric structure 11, and using a reticle to pattern the photoresist layer. In some example embodiments, the process that etches the dielectric structure 11 may include using the patterned photoresist layer as an etching mask to pattern the dielectric structure 11. In some example embodiments, the patterning may include patterning with one or more of a deep ultraviolet (DUV) lithography process, a mid ultraviolet (MUV) lithography process, an X-ray lithography process, or an extreme ultraviolet (EUV) process; however, example embodiments are not limited thereto. In some example embodiments, the etching of the dielectric structure 11 may include etching with a dry etching process and/or with a wet-etching process; however, example embodiments are not limited thereto.

The connection opening OP may expose the first conductive contact 51 and the second conductive contact 52. In some example embodiments, the first conductive contact 51 may not be provided, and the connection opening OP may expose the first conductive structure 22. In some example embodiments, the second conductive contact 52 may not be provided, and the connection opening OP may expose the second conductive structure 42.

Figure 2D:
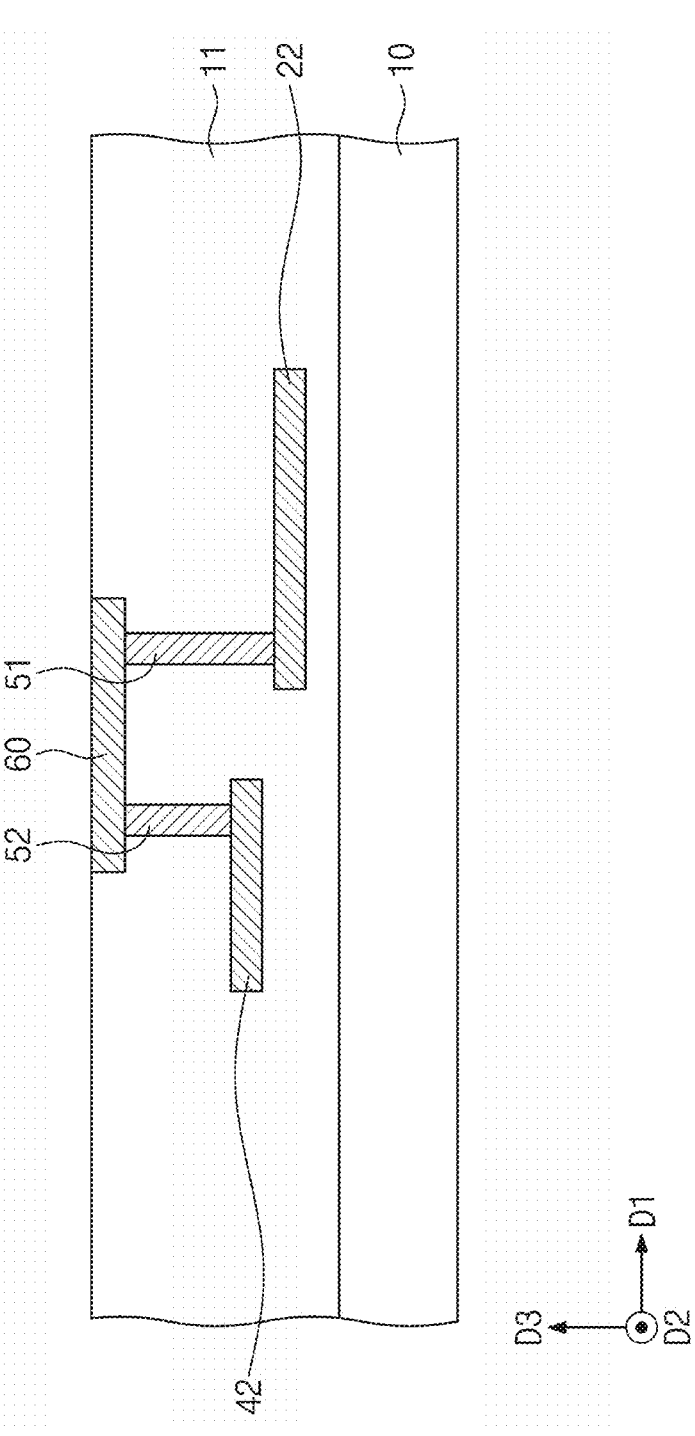

Referring to FIGS. 1 and 2D, a connection conductive structure 60 may be formed to electrically connect the first conductive structure 22 to the second conductive structure 42 (S20). The connection opening OP may be filled with a conductive material to form the connection conductive structure 60. The connection conductive structure 60 may be formed to compensate a misalignment between the first conductive structure 22 and the second conductive structure 42. In some example embodiments, the connection conductive structure 60 may be formed to compensate a misalignment between the first conductive contact 51 and the second conductive contact 52. In some example embodiments, the connection conductive structure may be formed with a damascene process including the deposition of a conducive element such as copper, followed by a planarization process such as a chemical-mechanical planarization process; however, example embodiments are not limited thereto.

The connection conductive structure 60 may be connected to the first conductive contact 51 and the second conductive contact 52. The first conductive structure 22 may be electrically connected to the second conductive structure 42 through the first conductive contact 51, the connection conductive structure 60, and the second conductive contact 52. In some example embodiments, the first conductive contact 51 may not be provided, and the connection conductive structure 60 may be directly connected to the first conductive structure 22. In some example embodiments, the second conductive contact 52 may not be provided, and the connection conductive structure 60 may be directly connected to the second conductive structure 42.

Figure 3:
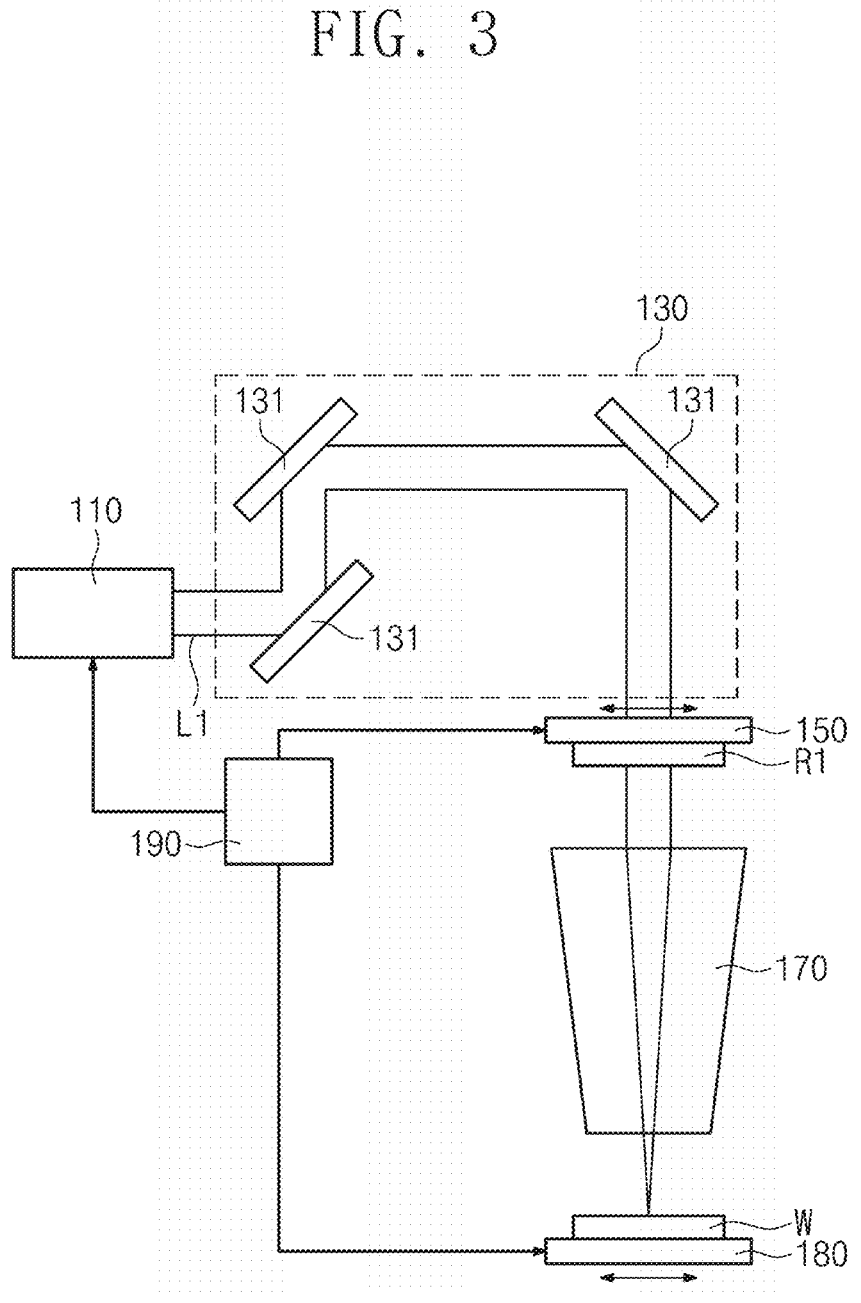
FIG. 3 illustrates a schematic diagram showing an exposure apparatus according to some example embodiments.

FIG. 3 illustrates a schematic diagram showing an exposure apparatus according to some example embodiments.

Referring to FIG. 3, an exposure apparatus may include a light source section 110, a transmission section 130, a projection section 170, and a control section 190. The light source section 110 may emit a first light L1.

The transmission section 130 may provide a first reticle R1 with the first light L1 generated from the light source section 110. The transmission section 130 may include a plurality of optics 131 that guide the first light L1 to the first reticle R1, and the optics 131 may be or may include lenses and/or mirrors.

The first reticle R1 may be provided on a reticle stage 150. The first reticle R1 may be, for example, a transmissive type reticle, indicating that reference light passes through portions of the reticle while some light is absorbed by the reticle. Although not shown, a number, such as three clamps may be used to rigidly place the first reticle R1 on the reticle stage 150, and the clamps may be positioned on an edge of the first reticle R1. The reticle stage 150 may include a material that is transparent to the first light L1 generated from the light source section 110.

The projection section 170 may cause the first light L1 that has passed through the reticle stage 150 and the first reticle R1 to concentrate on one point on a substrate such as a wafer W. The projection section 170 may include, for example, a plurality of condenser lenses. The condenser lenses of the projection section 170 may reduce the first light L1, which has passed through the first reticle R1, at certain magnifications (e.g., 4 times, 6 times, or 8 times) and then may project the first light L1 to the wafer W.

The wafer W may be provided on a wafer stage 180. A top surface of the wafer W may be coated thereon with a photoresist material that is responsive to the first light L1. The photoresist material may be exposed with the first light L1.

The photoresist material exposed with the first light L1 may be developed to form photoresist patterns. The photoresist patterns may be used as an etching mask to form patterns on the wafer W.

The control section 190 may be connected to and control the light source section 110, the reticle stage 150, and the wafer stage 180. For example, the control section 190 may control drive motors that are correspondingly associated with the reticle stage 150 and the wafer stage 180. The drive motors may induce movement of the reticle stage 150 and the wafer stage 180. The drive motors may drive the reticle stage 150 and the wafer stage 180 to rotate in a clockwise direction and/or a counterclockwise direction.

Figure 4:
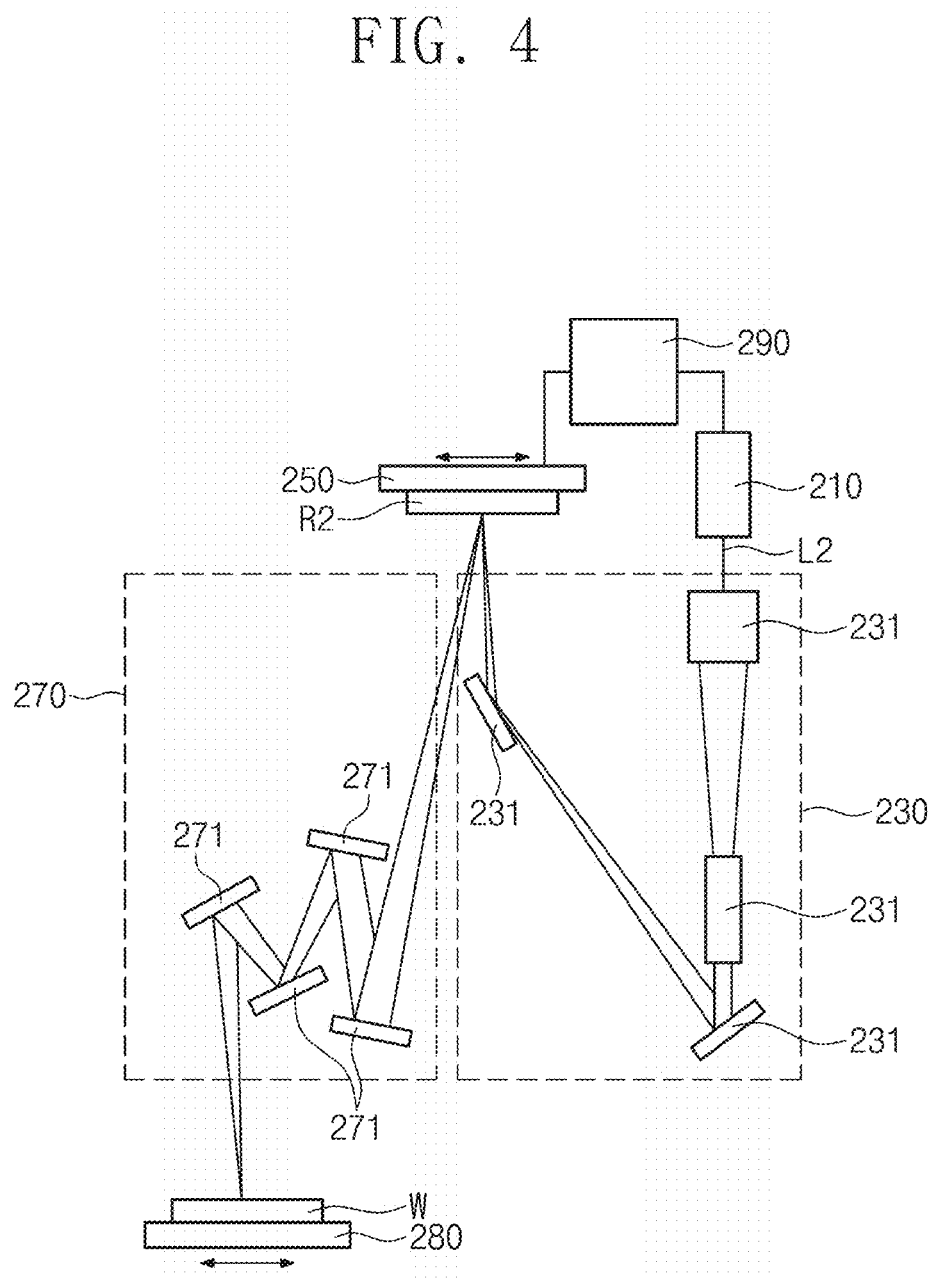
FIG. 4 illustrates a schematic diagram showing an exposure apparatus according to some example embodiments.

FIG. 4 illustrates a schematic diagram showing an exposure apparatus according to some example embodiments.

Referring to FIG. 4, an exposure apparatus may include a light source section 210, a transmission section 230, a projection section 270, and a control section 290. The light source section 210 may emit a second light L2.

The transmission section 230 may provide a second reticle R2 with the second light L2 generated from the light source section 210. The transmission section 230 may include a plurality of optics 231 that guide the second light L2 to the second reticle R2, and the optics 231 may be lenses and/or mirrors. The optics 231 of the transmission section 230 may guide the second light L2 to allow the second reticle R2 to receive oblique incidence of the second light L2.

The second reticle R2 may be provided on a reticle stage 250. The second reticle R2 may be, for example, a reflective type exposure reticle, e.g. a reticle that reflects incident light. Although not shown, a plurality of clamps, such as two, three, or more than three clamps may be used to rigidly place the second reticle R2 on the reticle stage 250, and the plurality of clamps may be disposed at a regular interval on an entire rear surface of the second reticle R2. The reticle stage 250 may include a material capable of reflecting the second light L2 generated from the light source section 210.

The projection section 270 may cause the second light L2 that has been reflected from the reticle stage 250 and the second reticle R2 to concentrate on one point on a substrate such as a wafer W. The projection section 270 may include a plurality of optics 271 that guide the second light L2 to one point on the wafer W, and the optics 271 may include lenses and/or mirrors. The optics 271 of the projection section 270 may reduce the second light L2, which has been reflected from the second reticle R2, at certain magnifications (e.g., 4 times, 6 times, or 8 times) and then may project the second light L2 to the wafer W.

The wafer W may be provided on a wafer stage 280. A top surface of the wafer W may be coated thereon with a photoresist material responsive to the second light L2. The photoresist material may be exposed with the second light L2.

The photoresist material exposed with the second light L2 may be developed to form photoresist patterns. The photoresist patterns may be used as an etching mask to form patterns on the wafer W.

The control section 290 may be connected to and control the light source section 210, the reticle stage 250, and the wafer stage 280. For example, the control section 290 may control drive motors that are correspondingly associated with the reticle stage 250 and the wafer stage 280. The drive motors may induce movement of the reticle stage 250 and the wafer stage 280. The drive motors may drive the reticle stage 250 and the wafer stage 280 to rotate in a clockwise direction or a counterclockwise direction.

Figure 5:
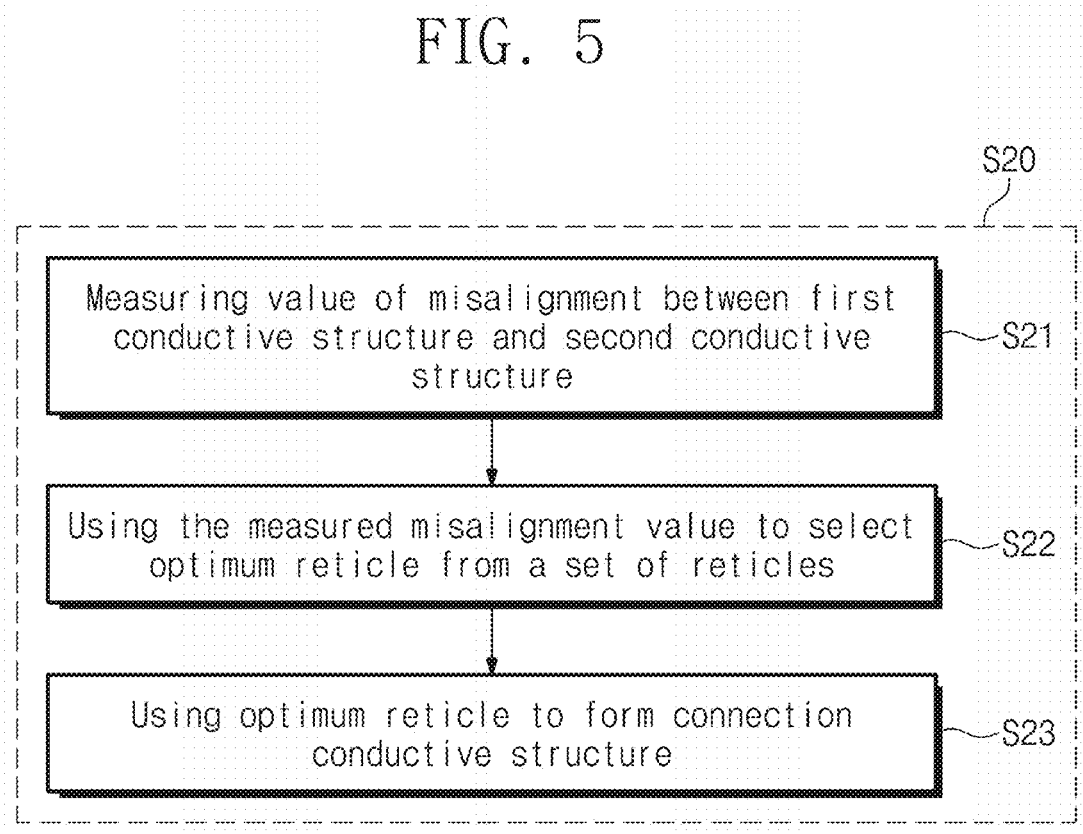
FIG. 5 illustrates a flow chart showing a method of forming a connection conductive structure according to some example embodiments.
Figure 6:
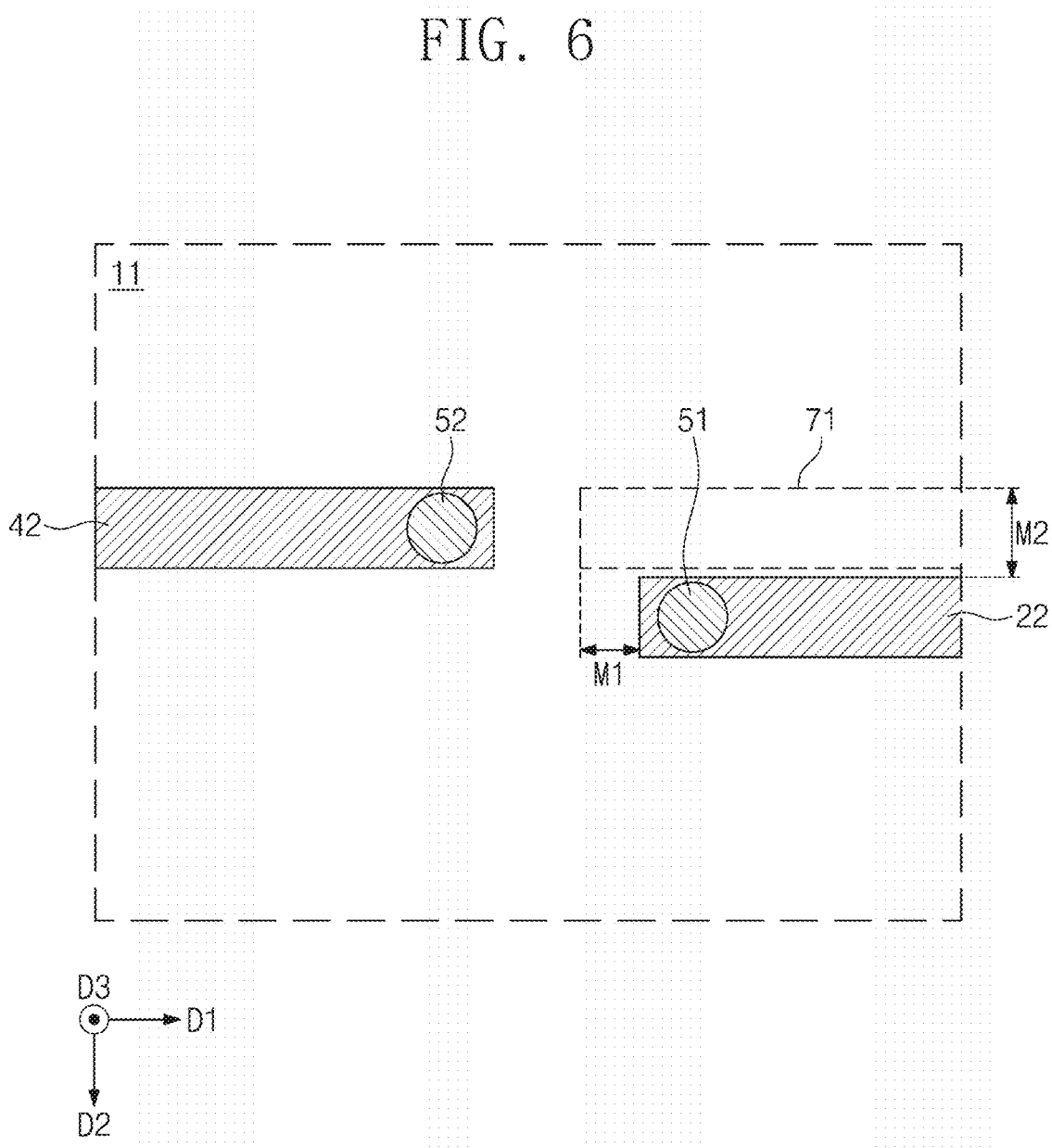
FIG. 6 illustrates a plan view showing a method of measuring a misalignment value according to some example embodiments.
Figure 7:
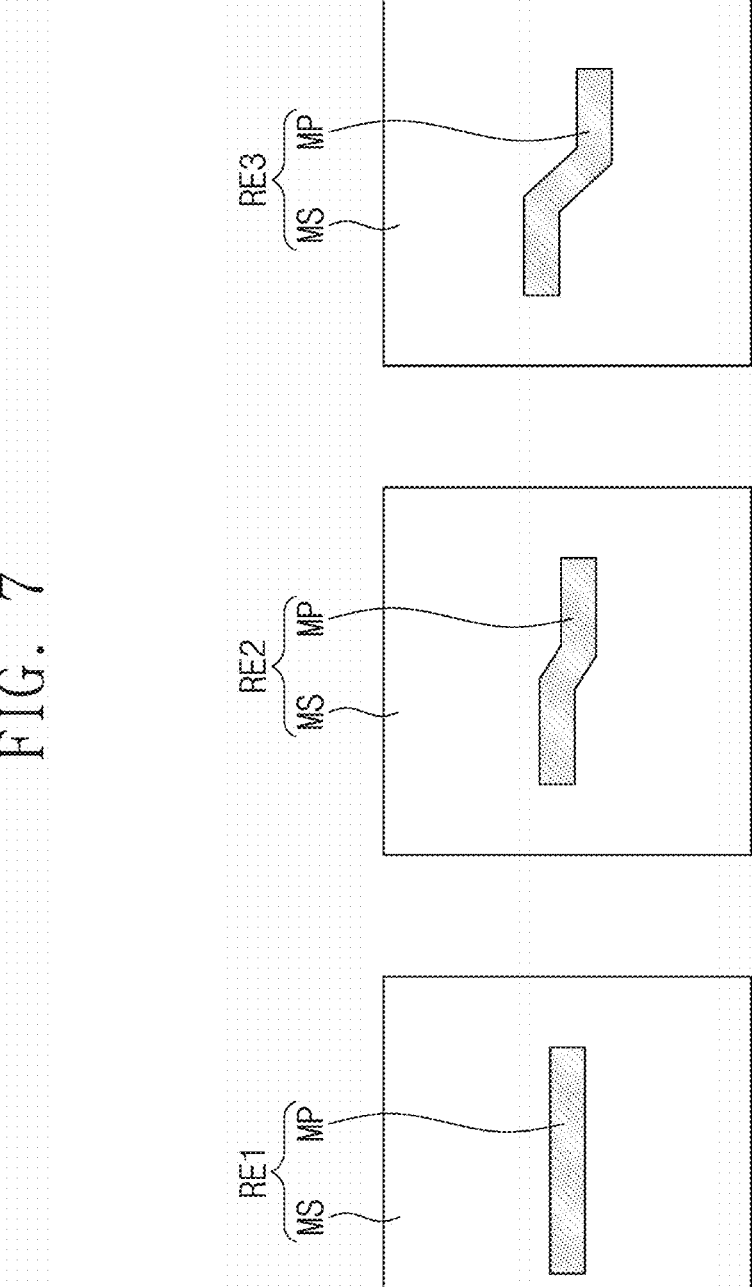
FIG. 7 illustrates a plan view showing a method of selecting a first reticle according to some example embodiments.
Figure 8A:
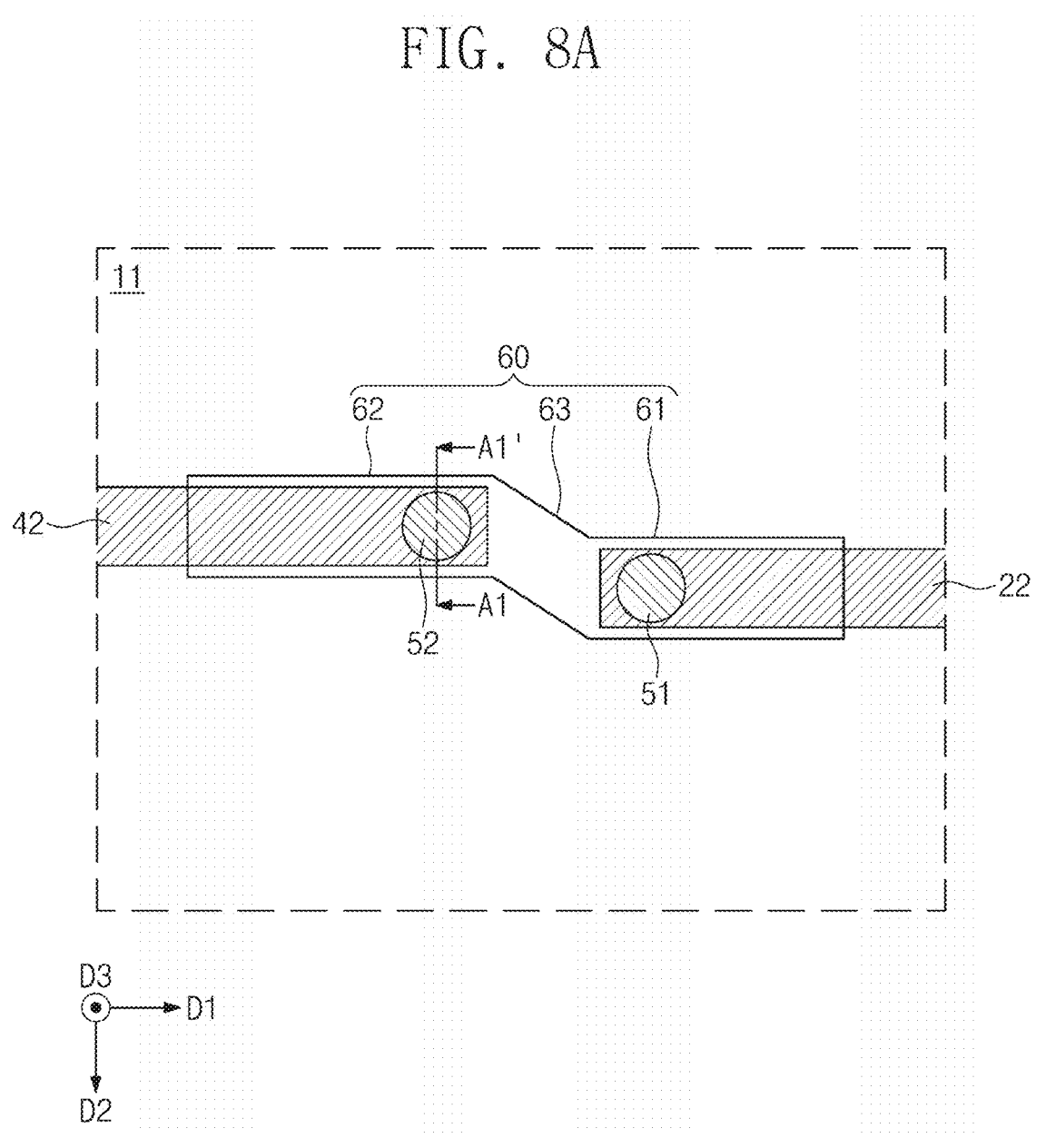
Figure 8B:
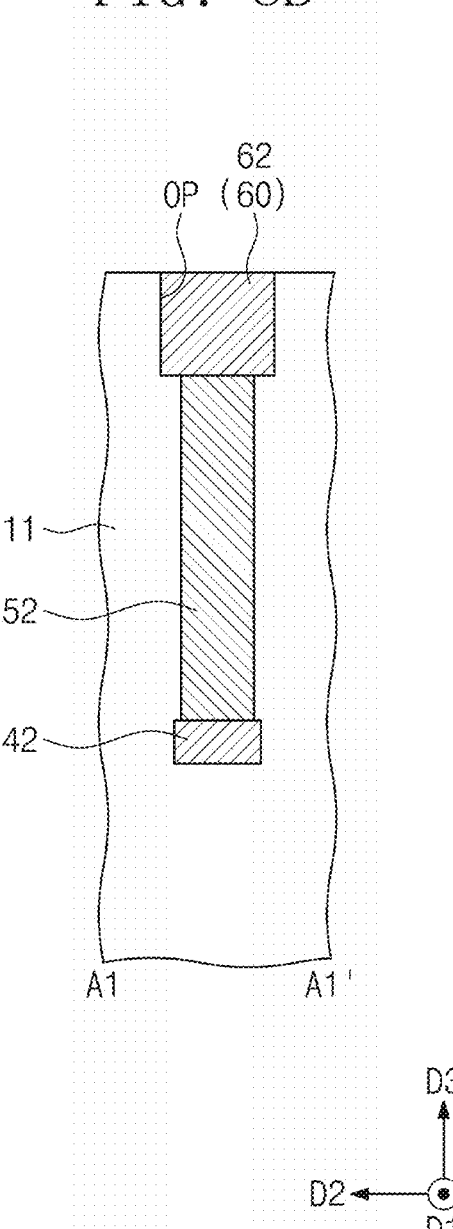
FIG. 8B illustrates a cross-sectional view taken along line A1-A1' of FIG. 8A.

FIG. 5 illustrates a flow chart showing a method of forming a connection conductive structure according to some example embodiments. FIG. 6 illustrates a plan view showing a method of measuring a misalignment value according to some example embodiments. FIG. 7 illustrates a plan view showing a method of selecting a first reticle according to some example embodiments. FIG. 8A illustrates a plan view showing a connection conductive structure formed according to some example embodiments. FIG. 8B illustrates a cross-sectional view taken along line A1-A1' of FIG. 8A.

Referring to FIG. 5, the step S20 of forming a connection conductive structure may include a step S21 of measuring a value of misalignment between a first conductive structure and a second conductive structure, a step S22 of using the measured misalignment value to select an optimum reticle, or a first reticle, or a selected reticle from a set of reticles, and a step S23 of using the selected reticle to form the connection conductive structure.

Referring to FIGS. 5 and 6, there may be a misalignment between the first conductive structure 22 and the second conductive structure 42. It may be possible to measure a value of misalignment between the first conductive structure 22 and the second conductive structure 42 (S21). The misalignment value between the first and second conductive structures 22 and 42 may include a first misalignment value in the first direction D1 and a second misalignment value in the second direction D2. The misalignment value may be measured or determined in various manners, such as but not limited to by using a scanning electron microscope (SEM) device and/or an optical device; however, example embodiments are not limited thereto.

A position for alignment of the first conductive structure 22 with the second conductive structure 42 may be defined to refer to an alignment position 71 of the first conductive structure 22. For example, when no misalignment or a reduced or acceptable amount of misalignment is provided between the first conductive structure 22 and the second conductive structure 42, the first conductive structure 22 may be disposed on the alignment position 71 of the first conductive structure 22.

The first misalignment value may be a value M1 indicative of how far the first conductive structure 22 is spaced apart in the first direction D1 from the alignment position 71 of the first conductive structure 22. The second misalignment value may be a value M2 which indicative of how far the first conductive structure 22 is spaced apart in the second direction D2 from the alignment position 71 of the first conductive structure 22. There may be other values of misalignment; for example, there may be a misalignment based on a rotation of the first conductive structure 22 with respect to the alignment position 71 of the first conductive structure 22; however, example embodiments are not limited thereto.

Referring to FIGS. 5 and 7, a set of reticles, such as two or more reticles such as RE1, RE2, and RE3 may be provided. The set of reticles RE1, RE2, and RE3 may include a first reticle RE1, a second reticle RE2, and a third reticle RE3. No limitation is imposed on the number of reticles included in the set of reticles RE1, RE2, and RE3. In some example embodiments, the number of reticles may be two, four, or more.

Each of the first, second, and third reticles RE1, RE2, and RE3 may include a mask substrate MS and a mask pattern MP. The mask pattern MP may be provided on the mask substrate MS. The mask pattern MP may include a material that absorbs light. The mask substrate MS may include a material that allows light to reflect or penetrate. In some example embodiments, at least one or each of the first, second, and third reticles RE1, RE2, and RE3 may include a pellicle that protects the mask pattern MP and a frame between the pellicle and the mask substrate MS.

The mask pattern MP included in one of the first, second, and third reticles RE1, RE2, and RE3 may have a shape different from that of the mask pattern MP included in another of the first, second, and third reticles RE1, RE2, and RE3. For example, the mask pattern MP of the first reticle RE1 may have a shape different from that of the mask pattern MP of the second reticle RE2.

Based on the measured misalignment value, reticle may be selected from the set of reticles RE1, RE2, and RE3 (S22). In some example embodiments, when a certain one of the reticles RE1, RE2, and RE3 includes the mask pattern MP that corresponds to or is closest to the measured second misalignment value, the certain one may be selected as a first or selected reticle, e.g. as an optimum reticle, based on the measured second misalignment value. For example, among the first, second, and third reticles RE1, RE2, and RE3, the second reticle RE2 may be selected as a reticle such as an optimum reticle.

Referring to FIGS. 5, 8A, and 8B, the selected reticle may be used to form the connection conductive structure 60 (S23). The selected reticle may be used to form the connection opening OP. The connection opening OP may have a shape that corresponds to that of the mask pattern MP of the selected reticle. The connection opening OP may be formed in the dielectric structure 11. The connection opening OP may expose the first conductive contact 51 and the second conductive contact 52.

In some example embodiments, the formation of the connection opening OP by using a reticle such as a first or optimum reticle may include forming a photoresist layer on the dielectric structure 11, using the selected reticle to pattern the photoresist layer, and using the patterned photoresist layer to pattern the dielectric structure 11.

After the formation of the connection opening OP, the connection conductive structure 60 may be formed to fill the connection opening OP. The connection conductive structure 60 may have a shape that corresponds to that of the mask pattern MP of the selected reticle.

The connection conductive structure 60 may include a first portion 61, a second portion 62, and a third portion 63. The first portion 61 of the connection conductive structure 60 may be a part that wholly or at least partially overlaps in the third direction D3 with the first conductive structure 22 and the first conductive contact 51. An entirety of the first conductive contact 51 may overlap in the third direction D3 with the first portion 61 of the connection conductive structure 60. The first portion 61 of the connection conductive structure 60 may be in contact with a top surface of the first conductive contact 51.

The second portion 62 of the connection conductive structure 60 may be a part that wholly or at least partially overlaps in the third direction D3 with the second conductive structure 42 and the second conductive contact 52. An entirety of the second conductive contact 51 may overlap in the third direction D3 with the second portion 62 of the connection conductive structure 60. The second portion 62 of the connection conductive structure 60 may be in contact with a top surface of the second conductive contact 52.

The first and second portions 61 and 62 of the connection conductive structure 60 may extend in the first direction D1. The third portion 63 of the connection conductive structure 60 may extend in a direction that intersects the first direction D1 and the second direction D2. In some example embodiments, the third portion 63 of the connection conductive structure 60 may extend in the first direction D1, and the connection conductive structure 60 may have a straight shape.

The selection of a reticle may include selecting a reticle including the mask pattern MP for forming the connection conductive structure 60 that includes the first portion 61 overlapping the first conductive structure 22 and the first conductive contact 51 and also includes the second portion 62 overlapping the second conductive structure 42 and the second conductive contact 52. A reticle, such as an optimum reticle or a first reticle may be selected based on the measured second misalignment value between the first conductive structure 22 and the second conductive structure 42, and the connection conductive structure 60 formed by using the selected reticle may electrically connect the first conductive structure 22 to the second conductive structure 42. The selection of a reticle may compensate a misalignment in the second direction D2 between the first conductive structure 22 and the second conductive structure 42.

In some example embodiments, a misalignment between the first and second conductive contacts 51 and 52 may be wholly or at least partially compensated in accordance with the selection of a particular reticle. In this case, a value of misalignment between the first and second conductive contacts 51 and 52 may be measured, and based on the measured misalignment value, a reticle such as an optimum or first reticle may be selected from a set of reticles.

Figure 9A:
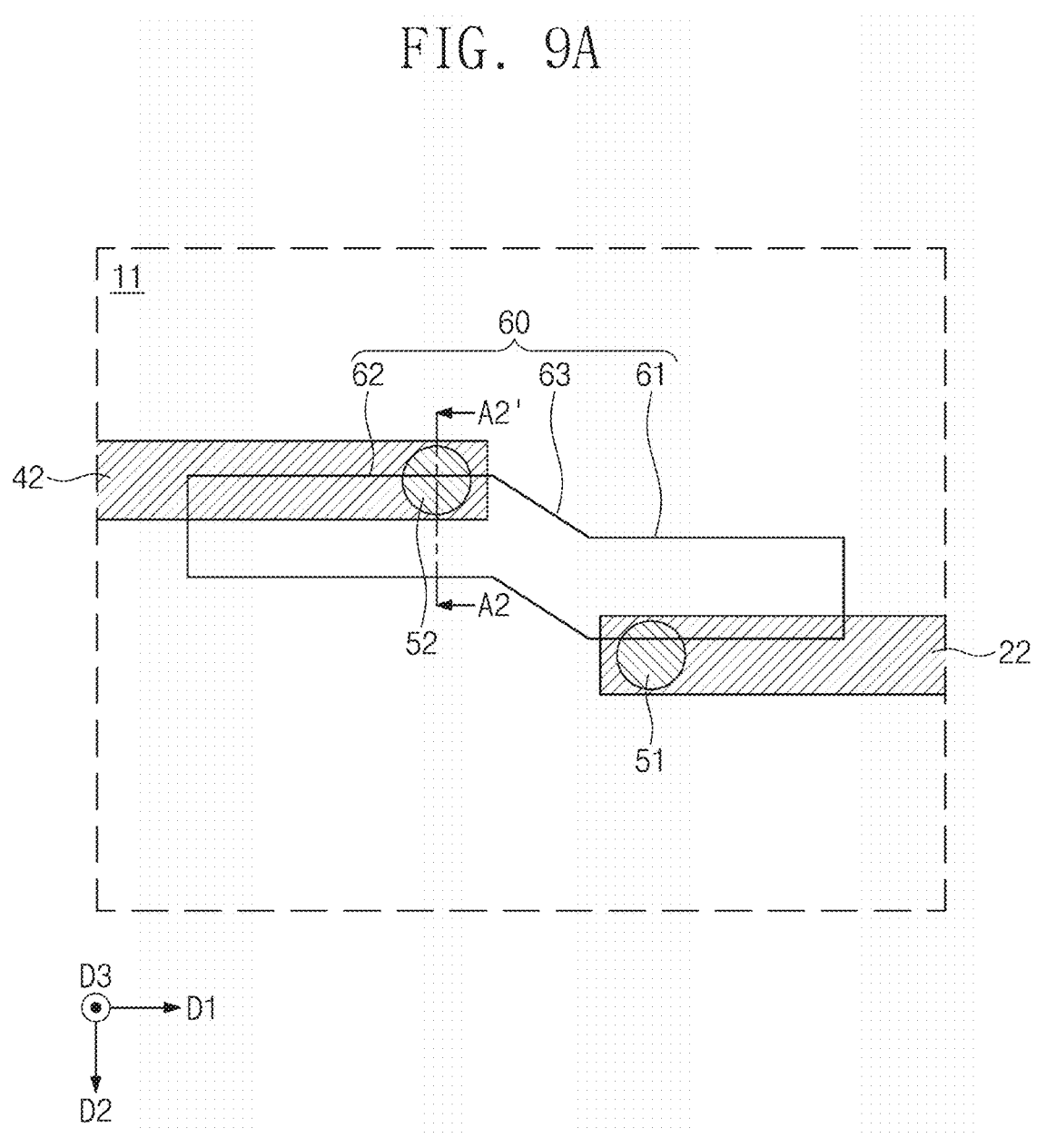
Figure 9B:
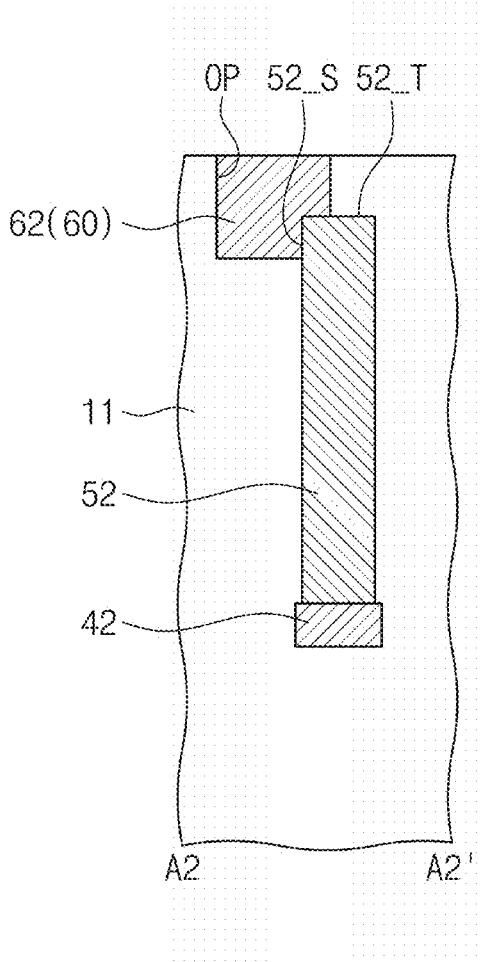
FIG. 9B illustrates a cross-sectional view taken along line A2-A2' of FIG. 9A.
Figure 9B:
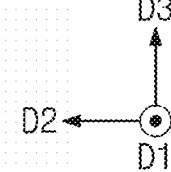

FIG. 9A illustrates a plan view showing a connection conductive structure formed according to some example embodiments. FIG. 9B illustrates a cross-sectional view taken along line A2-A2' of FIG. 9A.

Referring to FIGS. 9A and 9B, the selected reticle may be used to form the connection conductive structure 60 (S23). A portion of the first conductive contact 51 may overlap in the third direction D3 with the first portion 61 of the connection conductive structure 60. The first portion 61 of the connection conductive structure 60 may be in partial contact with a top surface and a sidewall of the first conductive contact 51.

A portion of the second conductive contact 52 may wholly or at least partially overlap in the third direction D3 with the second portion 62 of the connection conductive structure 60. The second portion 62 of the connection conductive structure 60 may be in partial contact with a top surface 52_T and a sidewall 52_S of the second conductive contact 52.

The selection of a reticle may include selecting a reticle including the mask pattern MP for forming the connection conductive structure 60 that includes the first portion 61 overlapping a portion of the first conductive contact 51 and also includes the second portion 62 overlapping a portion of the second conductive contact 52. Therefore, it may be possible to increase a range of tolerable misalignment, capable of being compensated by one reticle.

Figure 10:
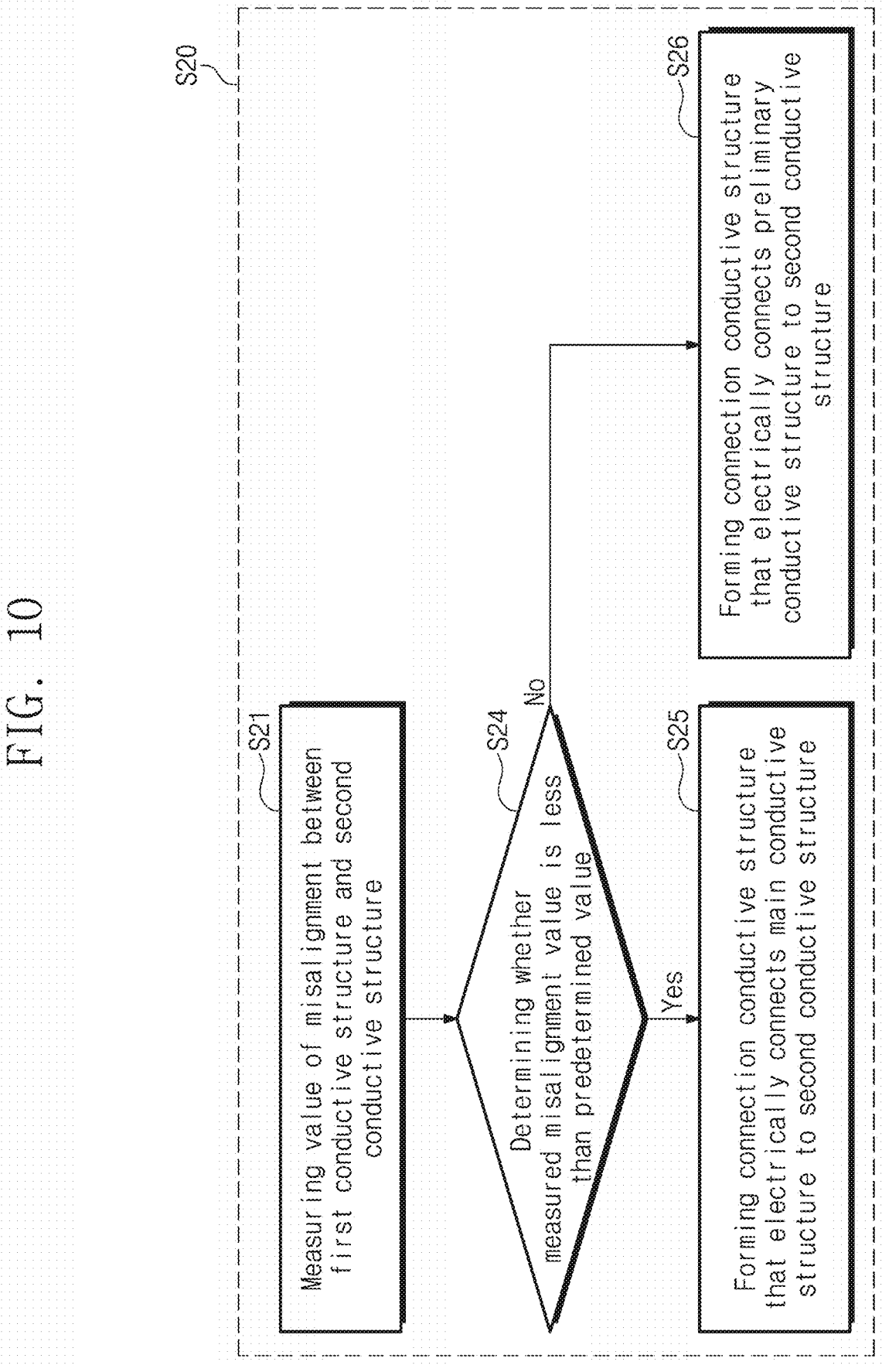
FIG. 10 illustrates a flow chart showing a method of forming a connection conductive structure according to some example embodiments.
Figure 11A:
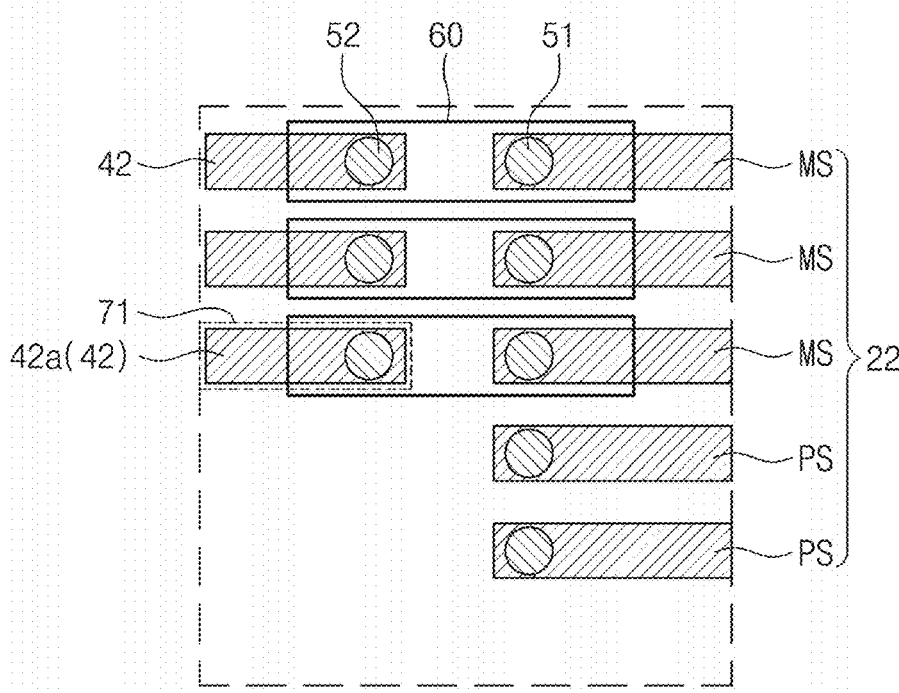
FIGS. 11A, 11B, and 11C illustrate plan views showing a method of forming a connection conductive structure of FIG. 10.
Figure 11B:
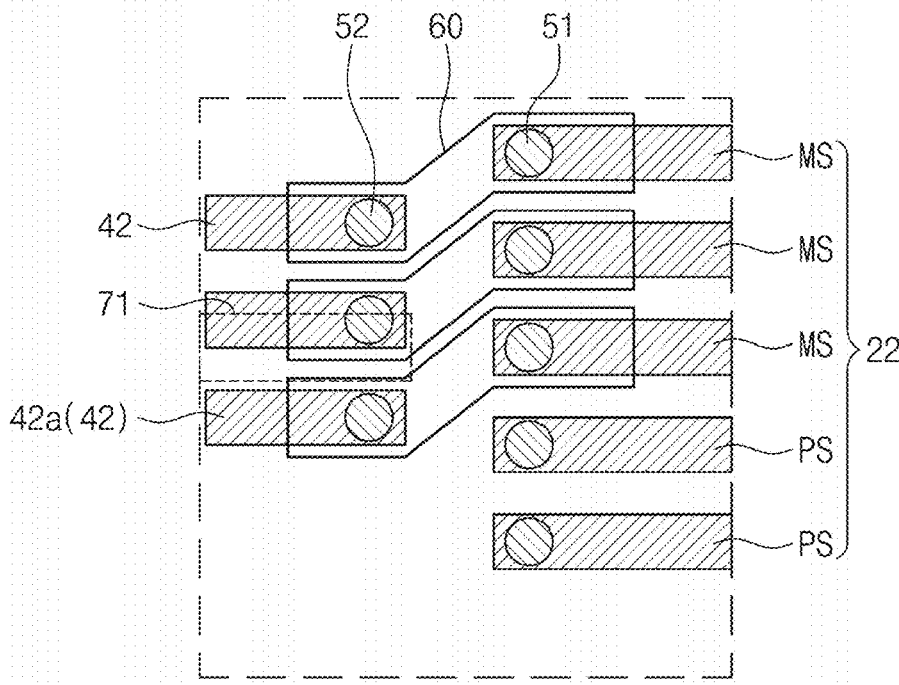
Figure 11C:
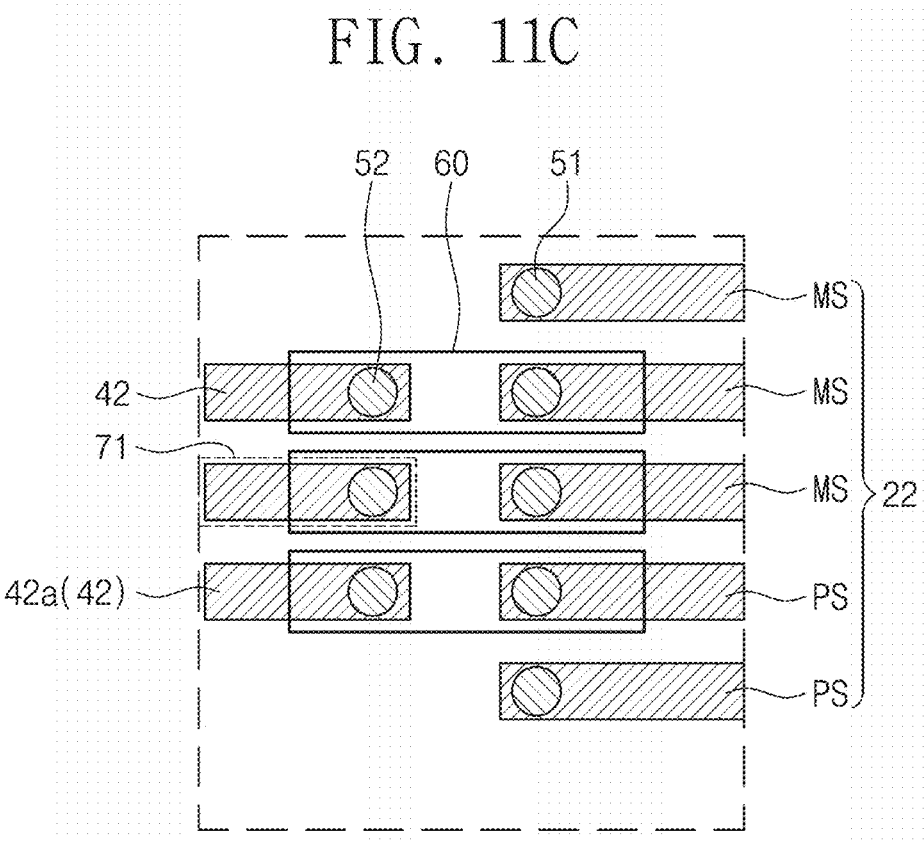

FIG. 10 illustrates a flow chart showing a method of forming a connection conductive structure according to some example embodiments. FIGS. 11A, 11B, and 11C illustrate plan views showing a method of forming a connection conductive structure of FIG. 10.

Referring to FIG. 10, the step S20 of forming a connection conductive structure may include a step S21 of measuring a value of misalignment between a first conductive structure and a second conductive structure, a step S24 of determining whether or not the measured misalignment value is less than a desired (or, alternatively, dynamically determined or predetermined, etc.) threshold value, a step S25 of forming a connection conductive structure that electrically connects a main conductive structure to the second conductive structure when the measured misalignment value is less than the particular value, and a step S26 of forming a connection conductive structure that electrically connects a preliminary conductive structure to the second conductive structure when the measured misalignment value is equal to or greater than the predetermined value.

Referring to FIGS. 10, 11A, 11B, and 11C, the first conductive structures 22 may include main conductive structures MS and preliminary conductive structures PS. The main and preliminary conductive structures MS and PS of the first conductive structures 22 may extend in the first direction D1, and the second conductive structures 42 may also extend in the first direction D1. The main and preliminary conductive structures MS and PS of the first conductive structures 22 may be arranged in the second direction D2.

A reference conductive structure 42a may be defined to explain a misalignment. For example, one of the second conductive structures 42 may be defined as the reference conductive structure 42a. There may be defined an alignment position 71 of the reference conductive structure 42a.

A misalignment value may be measured between the first conductive structures 22 and the second conductive structures 42 (S21). It may be determined whether or not the measured misalignment value is less than a desired (or, alternatively, dynamically determined or predetermined, etc.) threshold value (S24). In some example embodiments of FIGS. 11A, 11B, and 11C, the measured misalignment value may be the second misalignment value between the first conductive structure 22 and the second conductive structure 42, and the value may be a pitch in the second direction D2 of the first conductive structures 22 or the second conductive structures 42.

Referring to FIG. 11A, the first conductive structures 22 and the second conductive structures 42 may be disposed to cause the reference conductive structure 42a to reside on the alignment position 71 of the reference conductive structure 42a. For example, no misalignment may be provided in the second direction D2 between the first and second conductive structures 22 and 42. In this case, the second conductive structures 42 may be electrically connected through the connection conductive structures 60 to corresponding main conductive structures MS of the first conductive structures 22.

Referring to FIG. 11B, the first conductive structures 22 and the second conductive structures 42 may be disposed to cause the reference conductive structure 42a to lie spaced apart in the second direction D2 at less than the value from the alignment position 71 of the reference conductive structure 42a. For example, a value of misalignment in the second direction D2 between the first and second conductive structures 22 and 42 may be less than the value. In this case, the second conductive structures 42 may be electrically connected through the connection conductive structures 60 to corresponding main conductive structures MS of the first conductive structures 22.

Referring to FIG. 11C, the first conductive structures 22 and the second conductive structures 42 may be disposed to cause the reference conductive structure 42a to lie spaced apart in the second direction D2 at greater than the value from the alignment position 71 of the reference conductive structure 42a. For example, a value of misalignment in the second direction D2 between the first and second conductive structures 22 and 42 may be equal to or greater than the value. In this case, at least one of the second conductive structures 42 may be electrically connected through the connection conductive structure 60 to the preliminary conductive structure PS of the first conductive structures 22.

As the preliminary conductive structures PS are provided as discussed above, an electrical connection of the second conductive structures 42 may be obtained even when the first and second conductive structures 22 and 42 are misaligned at greater than the predetermined value.

Figure 12A:
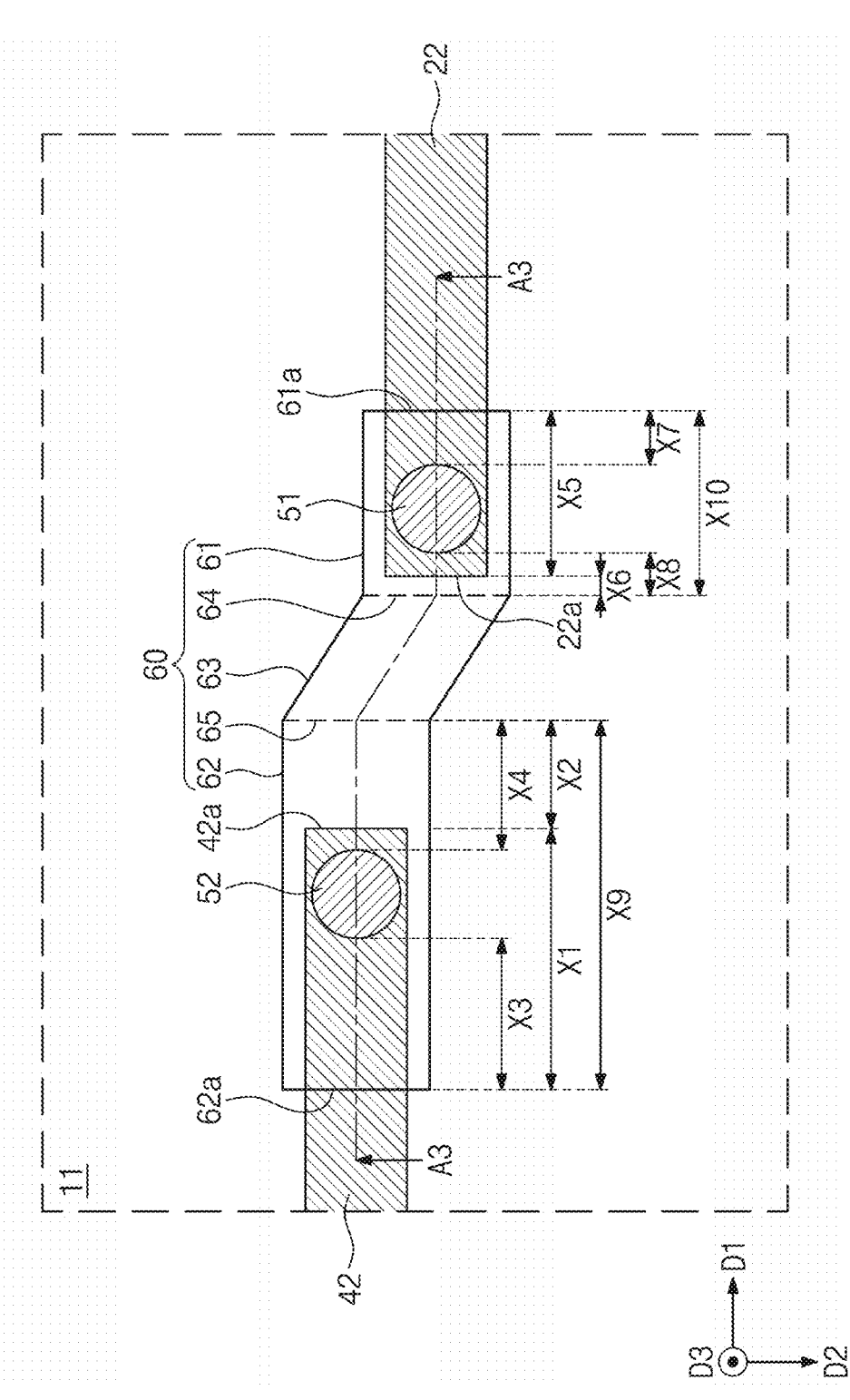
FIG. 12A illustrates a plan view showing a method of forming a connection conductive structure according to some example embodiments.
Figure 12B:
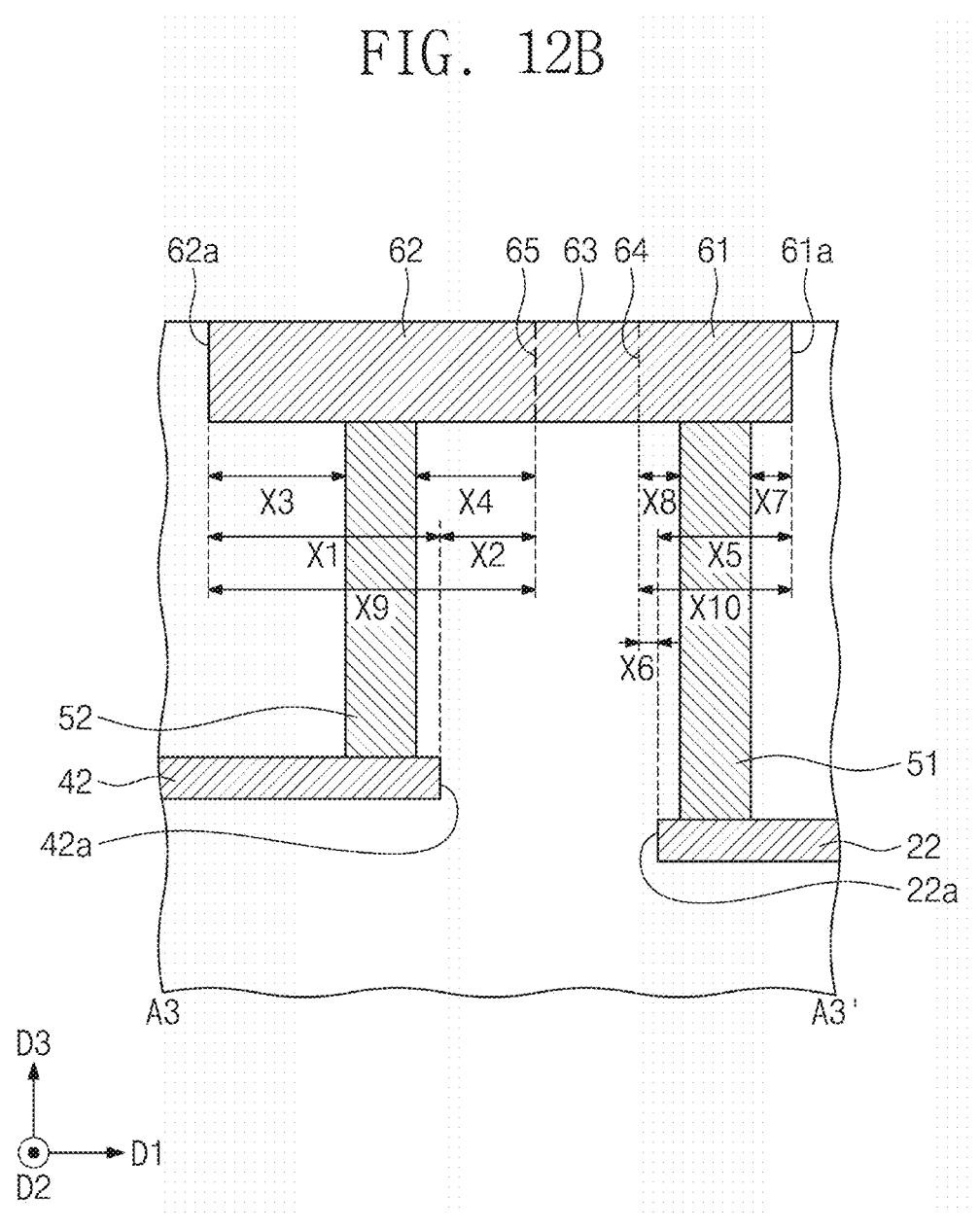

FIG. 12A illustrates a plan view showing a method of forming a connection conductive structure according to some example embodiments. FIG. 12B illustrates a cross-sectional view taken along line A3-A3' of FIG. 12A.

Referring to FIGS. 12A and 12B, a method of forming the connection conductive structure 60 according to some example embodiments may include forming the connection conductive structure 60 to align with a position of the first conductive structure 22.

The connection conductive structure 60 may include a first boundary 64 between the first portion 61 and the third portion 63, and may also include a second boundary 65 between the second portion 62 and the third portion 63. The first portion 61 of the connection conductive structure 60 may include a first outer sidewall 61a that is farthest from the second portion 62. The second portion 62 of the connection conductive structure 60 may include a second outer sidewall 62a that is farthest from the first portion 61. The first conductive structure 22 may include a first adjacent sidewall 22a nearby the second conductive structure 42. The second conductive structure 42 may include a second adjacent sidewall 42a nearby the first conductive structure 22.

A distance X1 in the first direction D1 between the second adjacent sidewall 42a of the second conductive structure 42 and the second outer sidewall 62a of the connection conductive structure 60 may be greater than a distance X5 in the first direction D1 between the first adjacent sidewall 22a of the first conductive structure 22 and the first outer sidewall 61a of the connection conductive structure 60.

A distance X2 in the first direction D1 between the second adjacent sidewall 42a of the second conductive structure 42 and the second boundary 65 of the connection conductive structure 60 may be greater than a distance X6 in the first direction d1 between the first adjacent sidewall 22a of the first conductive structure 22 and the first boundary 64 of the connection conductive structure 60.

A distance X3 in the first direction D1 between the second conductive contact 52 and the second outer sidewall 62a of the connection conductive structure 60 may be greater than a distance X7 in the first direction D1 between the first conductive contact 51 and the first outer sidewall 61a of the connection conductive structure 60.

A distance X4 in the first direction D1 between the second conductive contact 52 and the second boundary 65 of the connection conductive structure 60 may be greater than a distance X8 in the first direction D1 between the first conductive contact 51 and the first boundary 64 of the connection conductive structure 60.

A length X9 in the first direction D1 of the second portion 62 of the connection conductive structure 60 may be greater than a length X10 in the first direction D1 of the first portion 61 of the connection conductive structure 60.

As the connection conductive structure 60, the first conductive structure 22, the second conductive structure 42, the first conductive contact 51, and the second conductive contact 52 have the aforementioned structures (e.g., the length X9 in the first direction D1 of the second portion 62 of the connection conductive structure 60 is greater than the length X10 in the first direction D1 of the first portion 61 of the connection conductive structure 60), even when the connection conductive structure 60 is formed to align with a position of the first conductive structure 22, a misalignment in the first direction D1 may be compensated to obtain an electrical connection between the second conductive structure 42 and the connection conductive structure 60.

FIGS. 13A, 13B, 14A, 14B, 15A, 15B, 16, 17, and 18 illustrate diagrams showing a method of fabricating a semiconductor device according to some example embodiments.

Figure 13A:
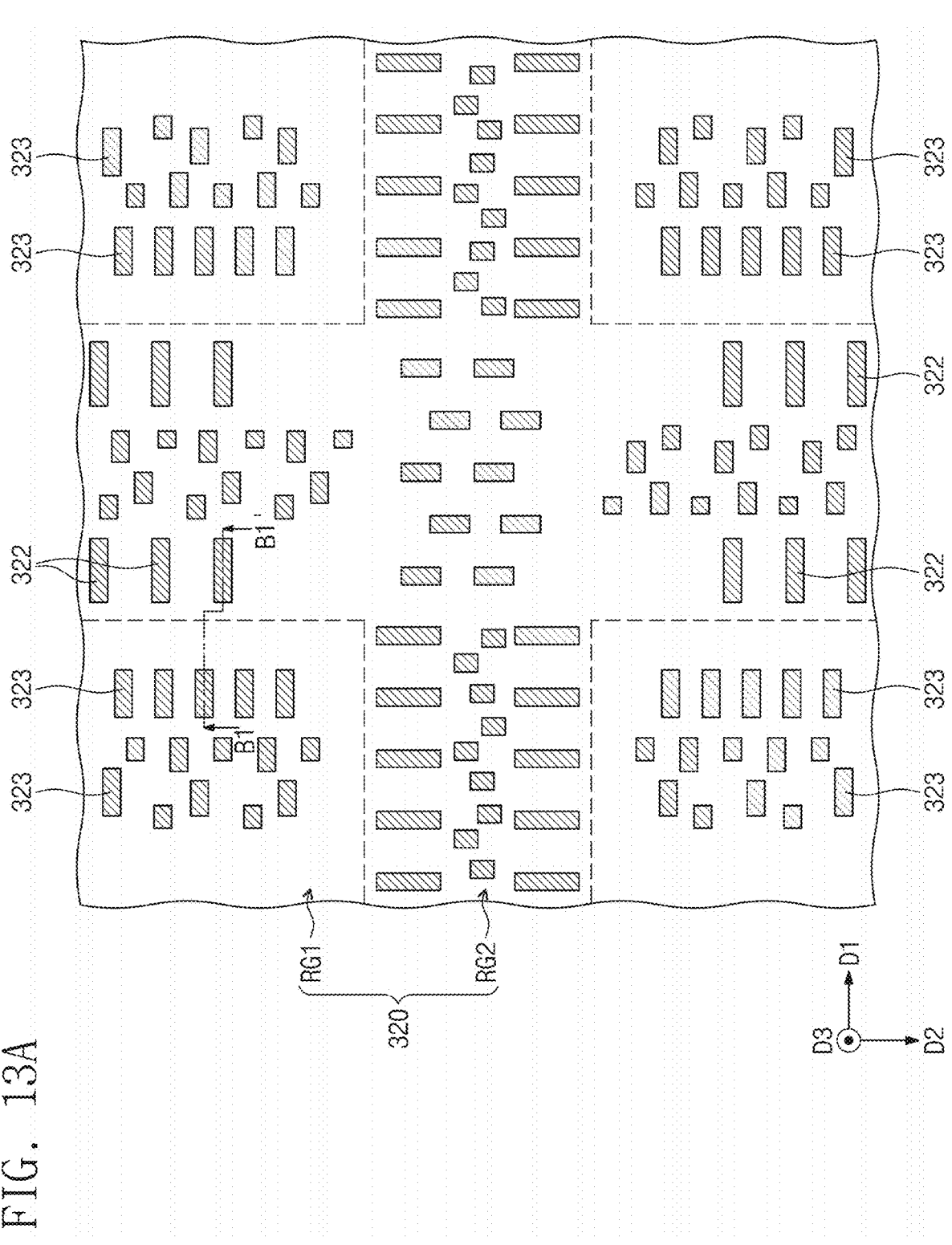
Figure 13B:
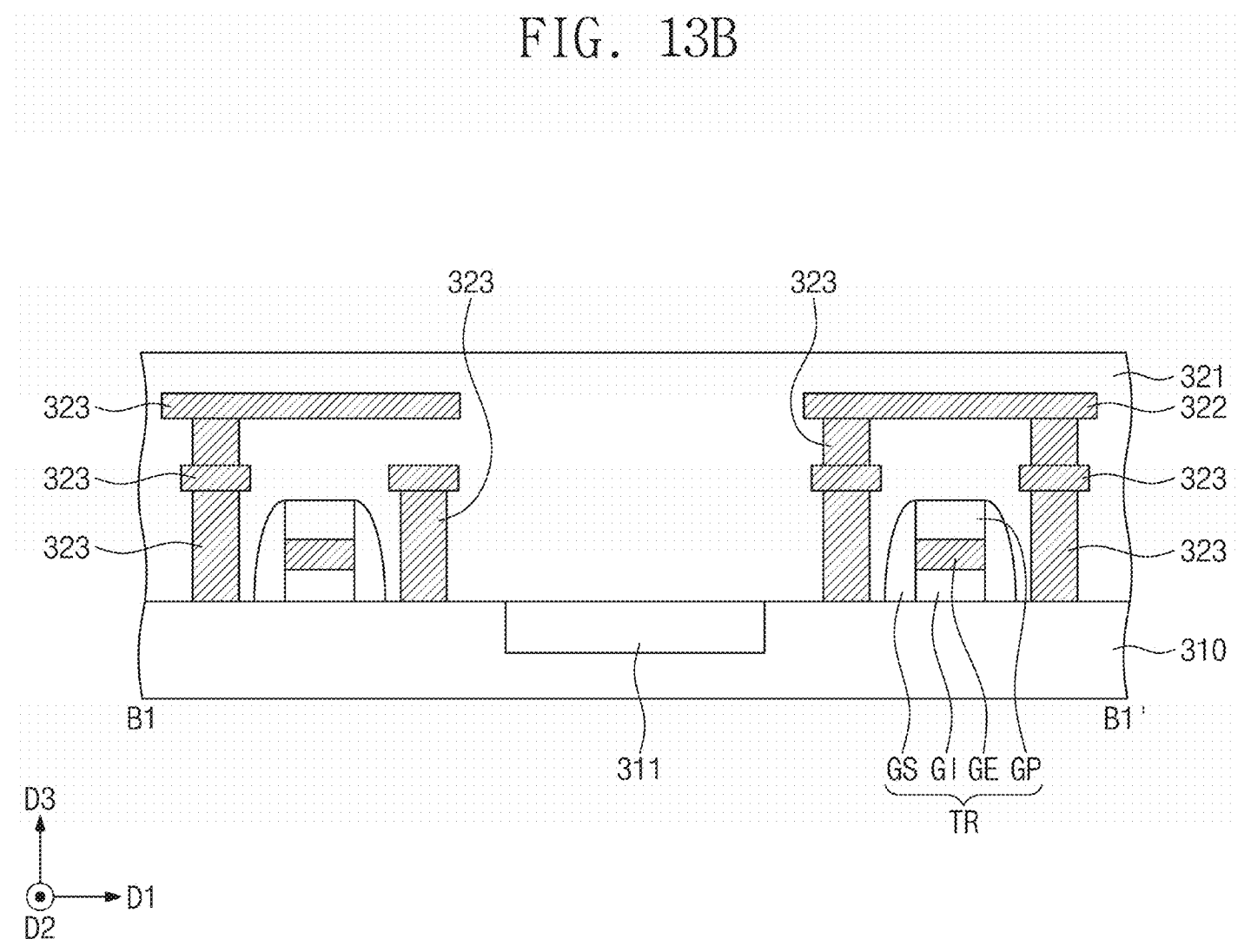

Referring to FIGS. 13A and 13B, a first bonding structure 320 may be formed on a first substrate 310.

Transistors TR may be provided on the first substrate 310. The transistor TR may include impurity regions, a channel between the impurity regions, and a gate structure between the impurity regions. The gate structure may include gate spacers GS, and may also include a gate dielectric layer GI, a gate electrode GE, and a gate capping layer GP that are disposed between the gate spacers GS. The impurity regions may be formed by implanting the first substrate 310 with impurities such as dopants such as one or more of boron, phosphorus, or arsenic. A dielectric material may be included in the gate spacers GS, the gate dielectric layer GI, and the gate capping layer GP. The gate electrode GE may include a conductive material such as but not limited to polysilicon such as doped polysilicon.

A device isolation layer 311 may be provided in the first substrate 310. The device isolation layer 311 may electrically separate the transistors TR from each other. The device isolation layer 311 may include a dielectric material.

The first bonding structure 320 may include a first dielectric structure 321, first conductive structures 322 in the first dielectric structure 321, and peripheral conductive structures 323 in the first dielectric structure 321. The first dielectric structure 321 may cover the transistors TR. The first dielectric structure 321 may include a dielectric material. In some example embodiments, the first dielectric structure 321 may include a plurality of dielectric layers.

The first conductive structure 322 may be defined to refer to one of conductive structures of the bonding structure 320 that is connected (e.g. directly connected) to a first conductive contact 351 which will be discussed below, and the peripheral conductive structure 323 may be defined to refer to another of conductive structures of the bonding structure 320 that is not directly connected to the first conductive contact 351.

The first conductive structure 322 may be connected to the peripheral conductive structure 323. The first conductive structures 322 may extend in a first direction D1. The peripheral conductive structure 323 may be connected to the transistor TR. The first conductive structure 322 may be electrically connected through the peripheral conductive structure 323 to the transistor TR. In some example embodiments, the peripheral conductive structure 323 may include at least one selected from conductive contacts and conductive lines. The first conductive structure 322 and the peripheral conductive structures 323 may include a conductive material.

The first bonding structure 320 may include first regions RG1 and a second region RG2. In some example embodiments, the first region RG1 may be a cell region, and the second region RG2 may be a peripheral region. The second region RG2 may separate the first regions RG1 from each other when viewed in plan. The first conductive structures 322 may be disposed on the second region RG2.

Figure 14A:
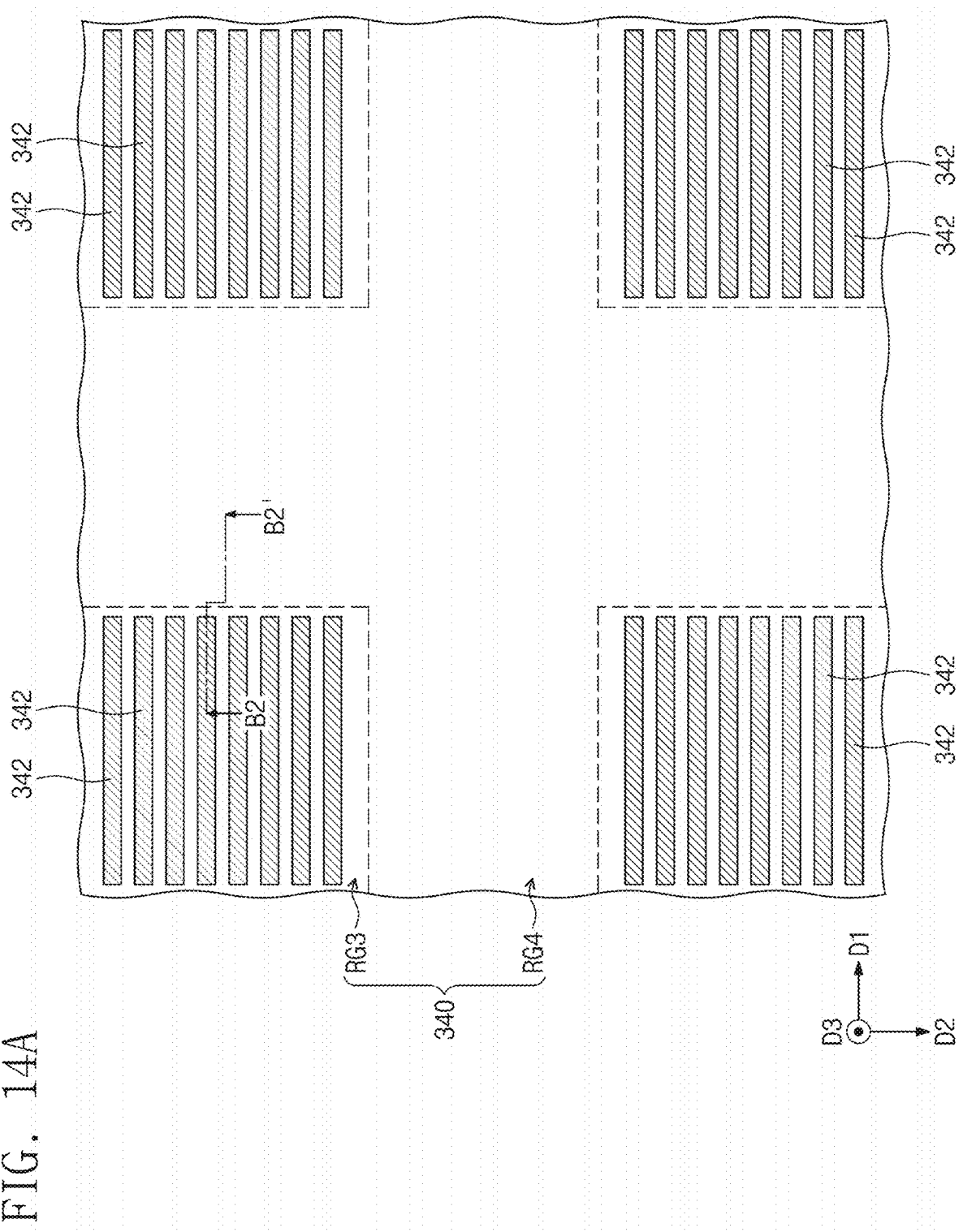
Figure 14B:
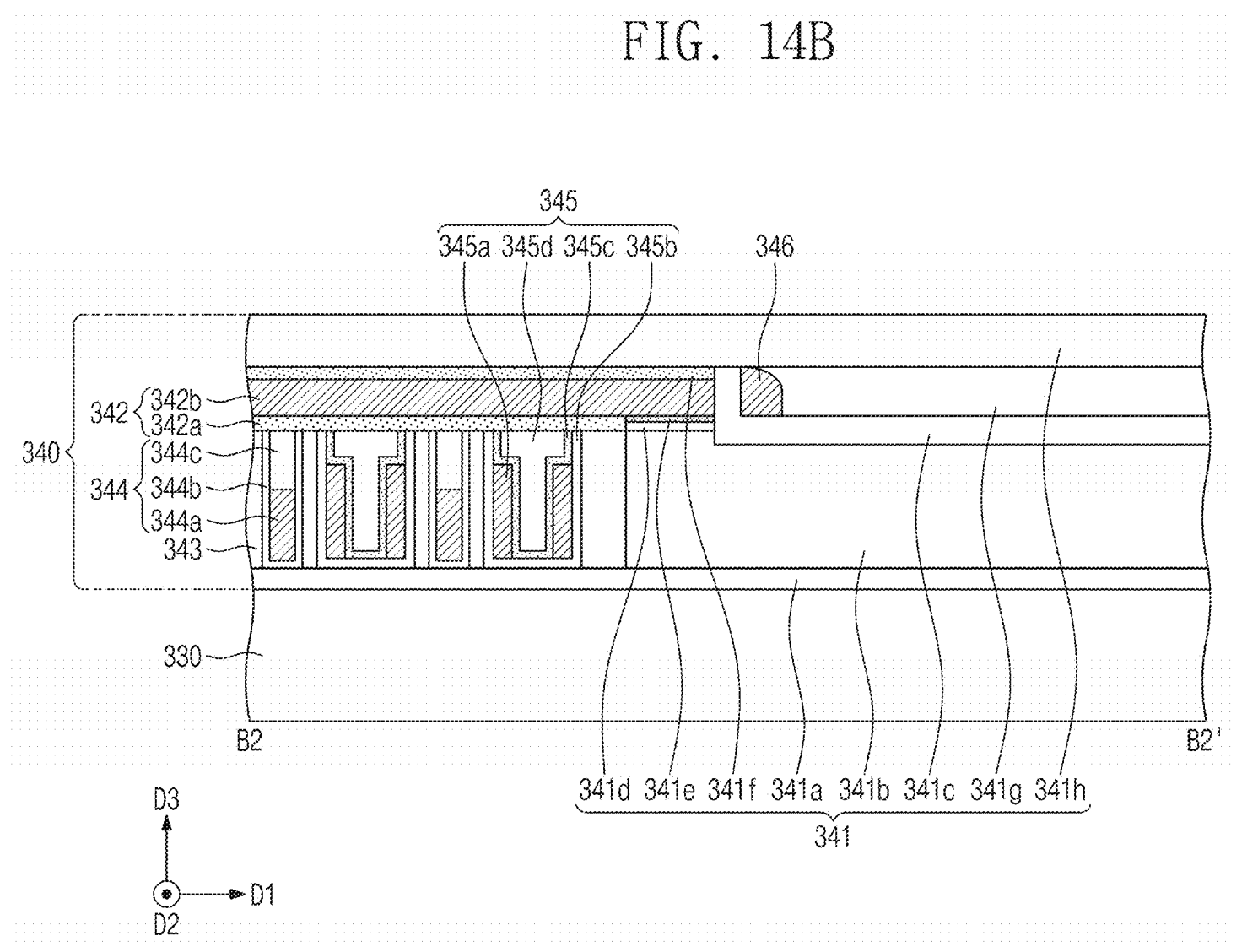

Referring to FIGS. 14A and 14B, a second bonding structure 340 may be formed on a second substrate 330. The second bonding structure 340 may a second dielectric structure 341, second conductive structures 342 in the second dielectric structure 341, semiconductor patterns 343 in the second dielectric structure 341, gate structures 344 in the second dielectric structure 341, word-line structures 345 in the second dielectric structure 341, and a shield metal 346 in the second dielectric structure 341.

The second dielectric structure 341 may include a first dielectric layer 341a on the second substrate 330, a second dielectric layer 341b on the first dielectric layer 341a, a third dielectric layer 341c of the second dielectric layer 341b, a fourth dielectric layer 341d on the second dielectric layer 341b, a fifth dielectric layer 341e on the fourth dielectric layer 341d, a sixth dielectric layer 341f on the second conductive structure 342, a seventh dielectric layer 341g on the third dielectric layer 341c, and an eighth dielectric layer 341h on the sixth and seventh dielectric layers 341f and 341g. The first to eighth dielectric layers 341a to 341h may include a dielectric material.

The gate structures 344 may be provided on the first dielectric layer 341a of the second dielectric structure 341. The gate structure 344 may include a gate dielectric layer 344b, a gate electrode 344a on the gate dielectric layer 344b, and a gate capping layer 344c on the gate electrode 344a. The gate dielectric layer 344b and the gate capping layer 344c may include a dielectric material. The gate electrode 344a may include a conductive material.

The word-line structures 345 may be provided on the first dielectric layer 341a of the second dielectric structure 341. The word-line structure 345 may include a word-line dielectric layer 345b, a word lines 345a on the word-line dielectric layer 345b, a word-line capping layer 345c that covers the word lines 345a, and a filling layer 345d on the word-line capping layer 345c. The word-line dielectric layer 345b, the word-line capping layer 345c, and the filling layer 345c may include a dielectric material. The word line 345a may include a conductive material.

The gate structures 344 and the word-line structures 345 may be alternately disposed along the first direction D1. One word-word line structure 345 may be disposed between two gate structures 344 that are adjacent to each other in the first direction D1. One gate structure 344 may be disposed between two word-line structures 345 that are adjacent to each other in the first direction D1.

The semiconductor pattern 343 may be provided between the gate structure 344 and the word-line structure 345. The semiconductor pattern 343 may include at least one selected from silicon and silicon-germanium. The semiconductor pattern 343 may define a channel. Impurities may be doped into at least a portion of the semiconductor pattern 343.

The second conductive structure 342 may be provided on the semiconductor patterns 343. The second conductive structure 342 may be electrically connected to the semiconductor pattern 343. The second conductive structure 342 may include a first conductive line 342a on the semiconductor patterns 343 and a second conductive line 342b on the first conductive line 342a. The first and second conductive lines 342a and 342b of the second conductive structure 342 may extend in the first direction D1. The first and second conductive lines 342a an 342b may include a conductive material. For example, the first conductive line 342a may include polysilicon, and the second conductive line 342b may include tungsten.

The shield metal 346 may be provided on the third dielectric layer 341c of the second dielectric structure 341. The shield metal 346 may include a conductive material.

The second bonding structure 340 may include third regions RG3 and a fourth region RG4. In some example embodiments, the third region RG3 may be a cell region, and the fourth region RG4 may be a peripheral region. The fourth region RG4 may separate the third regions RG3 from each other. The second conductive structures 342 may be disposed on the third region RG3.

Figure 15A:
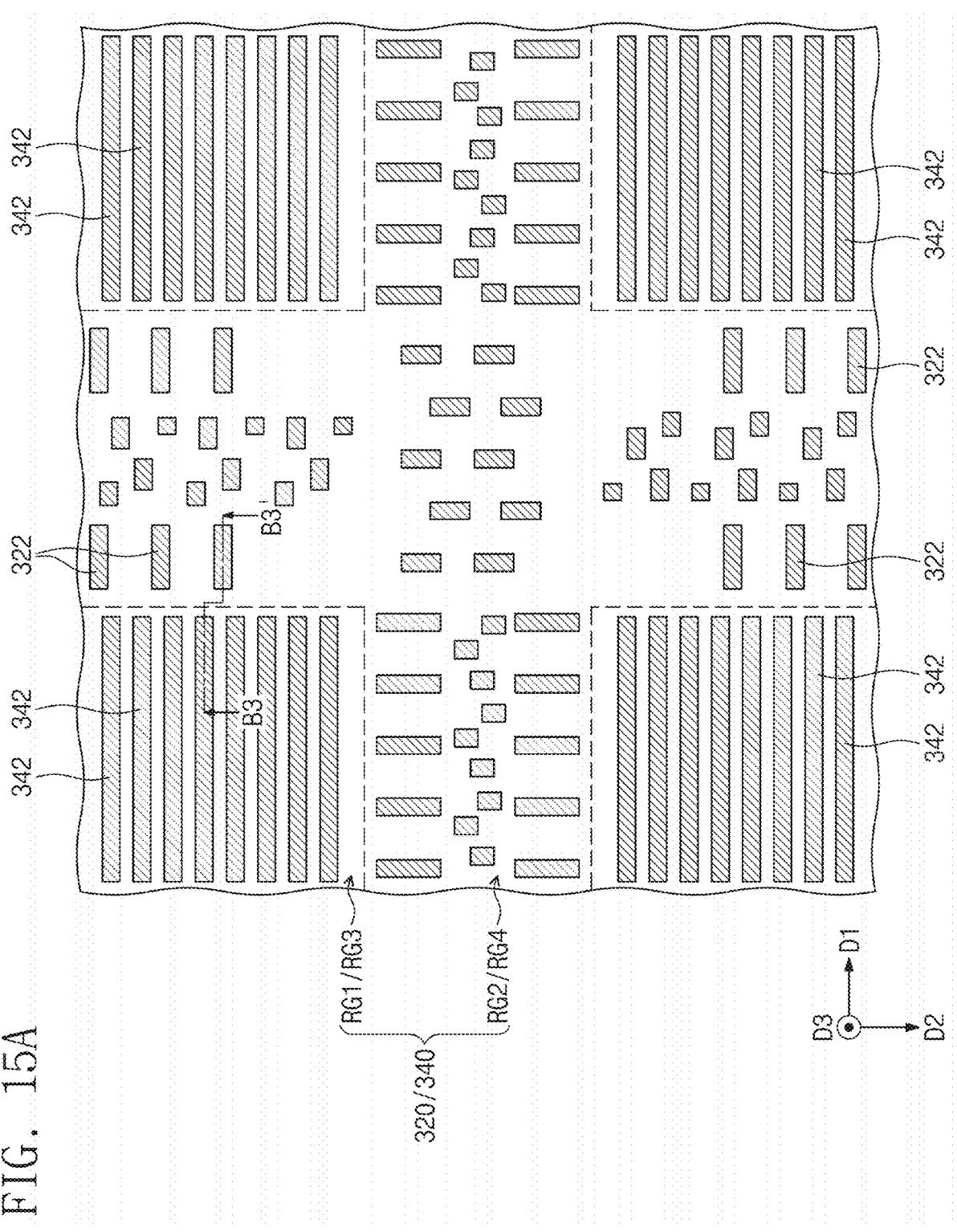
Figure 15B:
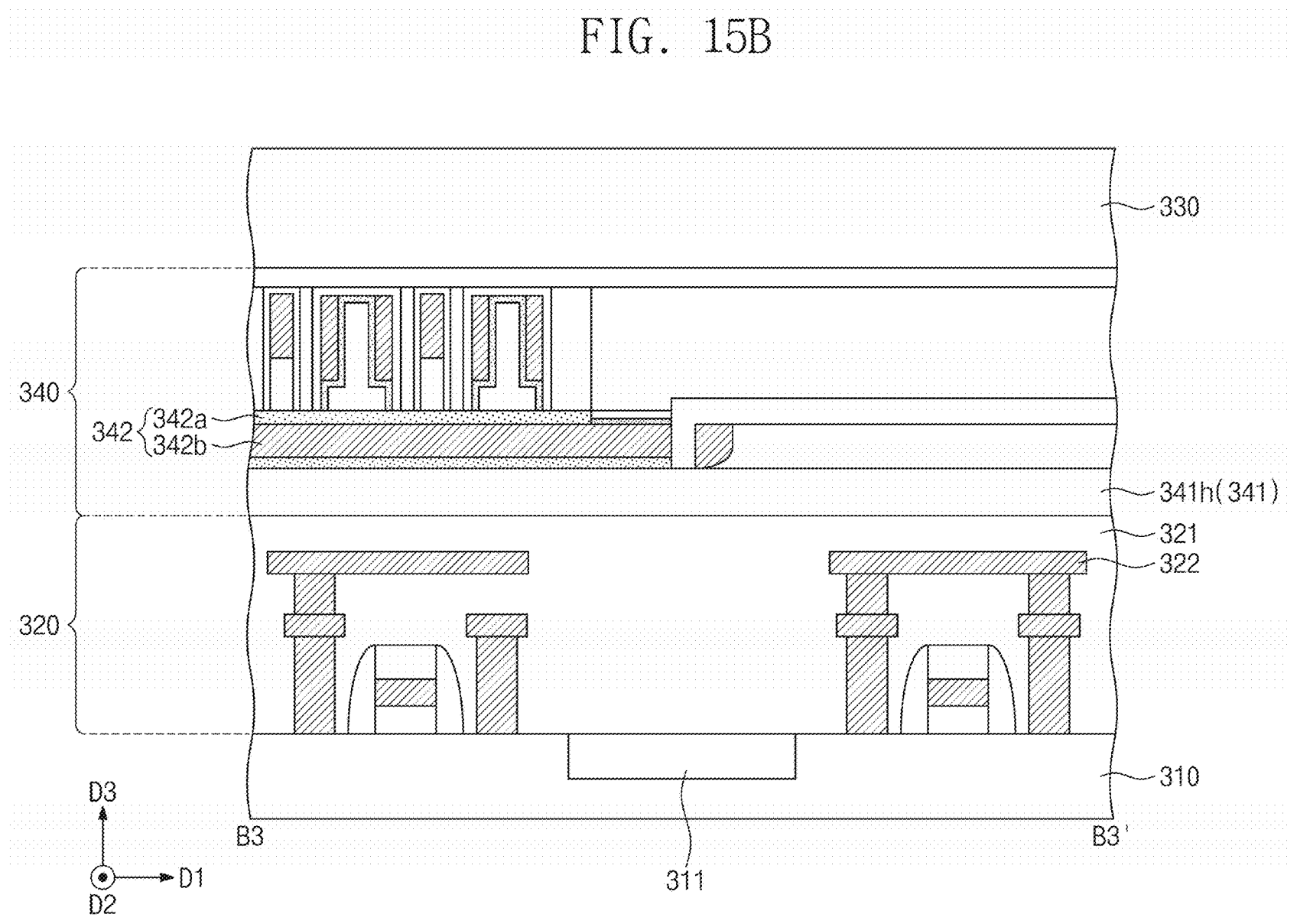

Referring to FIGS. 15A and 15B, the first bonding structure 320 and the second bonding structure 340 may be bonded to each other. A wafer bonding process may be performed to bond the first and second bonding structures 320 and 340 to each other. As the first and second bonding structures 320 and 340 are bonded to each other, the first region RG1 of the first bonding structure 320 may overlap the third region RG3 of the second bonding structure 340, and the second region RG2 of the first bonding structure 320 may overlap the fourth region RG4 of the second bonding structure 340. As the first and second bonding structures 320 and 340 are bonded to each other, the first dielectric structure 321 may be bonded to the eighth dielectric layer 341h of the second dielectric structure 341.

Figure 16:
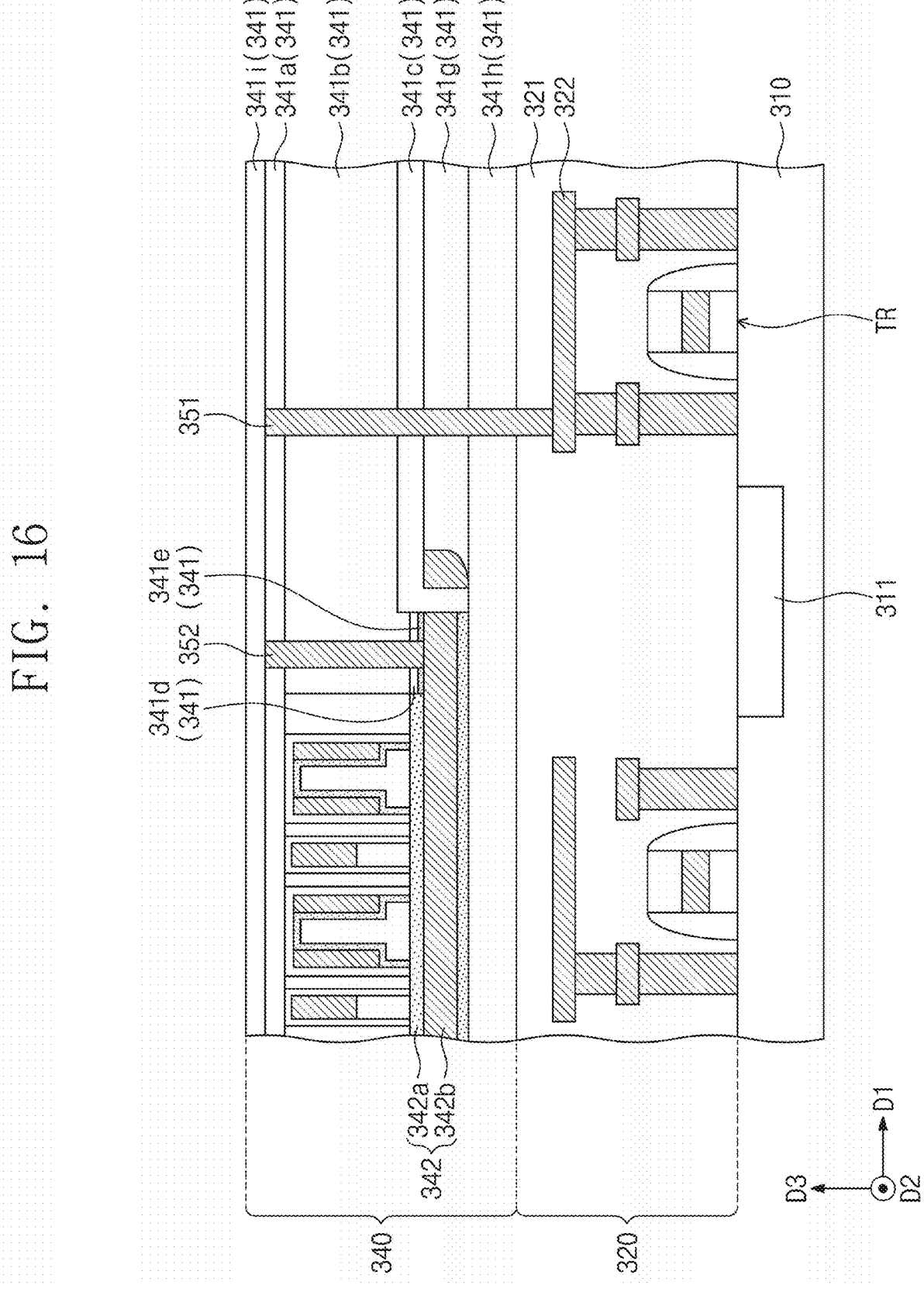

Referring to FIG. 16, the second substrate 330 may be removed. Afterwards, a first conductive contact 351 and a second conductive contact 352 may be formed. The first conductive contact 351 may be connected to the first conductive structure 322. The first conductive contact 351 may penetrate in the third direction D3 through the first, second, third, seventh, and eighth dielectric layers 341a, 341b, 341c, 341g, and 341h of the second dielectric structure 341 and through a portion of the first dielectric structure 321.

The second conductive contact 352 may be connected to the second conductive structure 342. The second conductive contact 352 may penetrate in the third direction D3 through the first, second, fourth, and fifth dielectric layers 341a, 341b, 341d, and 341e of the second dielectric structure 341.

A ninth dielectric layer 341i may be formed on the first conductive contact 351, the second conductive contact 352, and the first dielectric layer 341a. The second dielectric structure 341 may be defined to include the ninth dielectric layer 341i.

It may be possible to measure a value of misalignment caused by a bonding process of the first bonding structure 320 and the second bonding structure 340. The misalignment value may include a first misalignment value in the first direction D1 and a second misalignment value in the second direction D2. Based on the measured misalignment value, a first reticle may be selected from a set of reticles.

Figure 17:
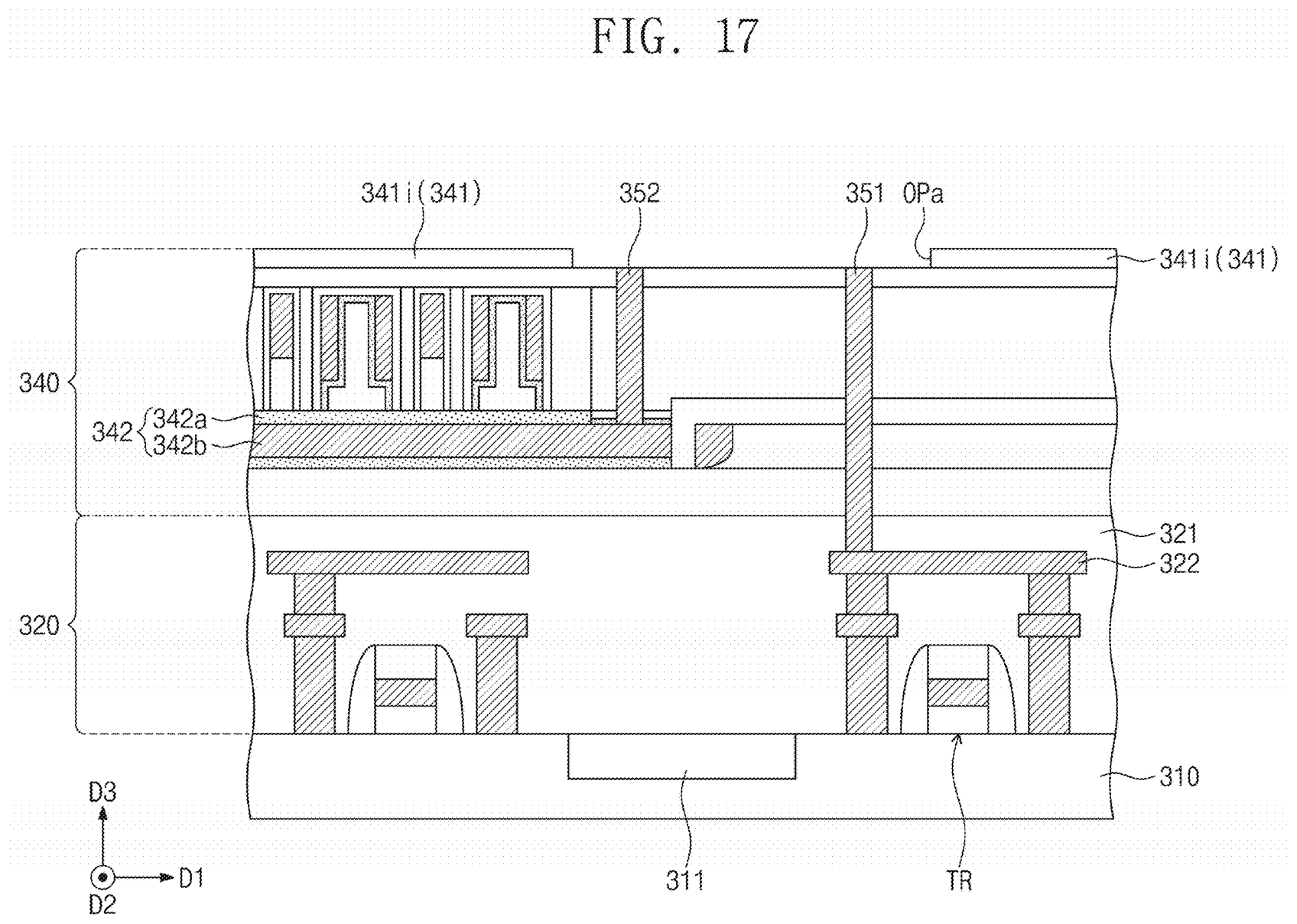

Referring to FIG. 17, a connection opening OPa may be formed to expose the first conductive contact 351 and the second conductive contact 352. The formation of the connection opening OPa may include performing a photolithography process on the selected reticle and performing a process that etched the second dielectric structure 341 of the second bonding structure 340.

Figure 18:
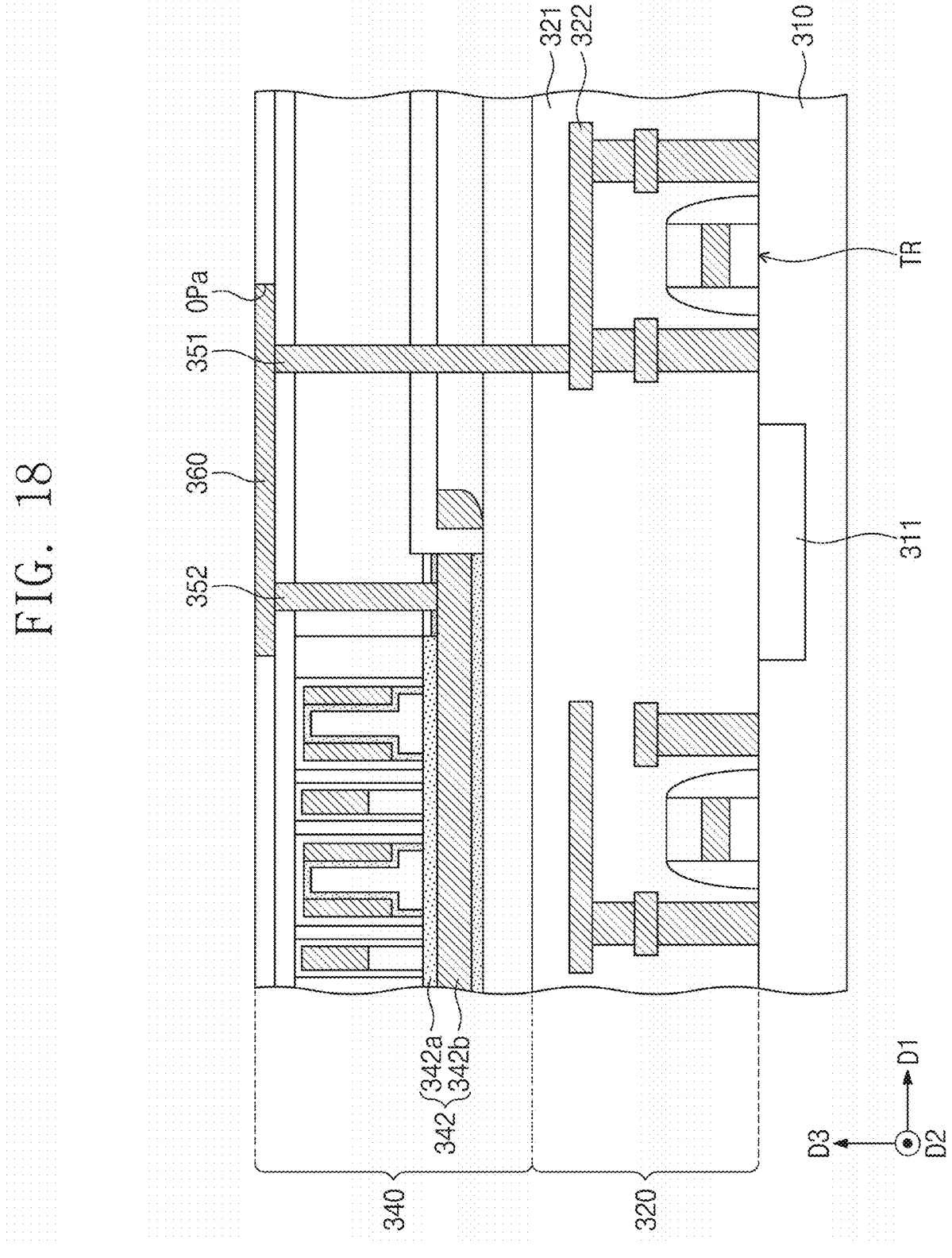

Referring to FIG. 18, a connection structure 360 may be formed. The connection opening OPa may be filled with a conductive material to form the connection conductive structure 360. The connection conductive structure 360 may be formed to compensate a misalignment caused by the bonding process of the first bonding structure 320 and the second bonding structure 340. The formation of the connection conductive structure 360 may allow the second conductive structure 342 of the second bonding structure 340 to electrically connect to the transistor TR through the second conductive contact 352, the connection conductive structure 360, the first conductive contact 351, the first conductive structure 322, and the peripheral conductive structures 323.

Figure 19:
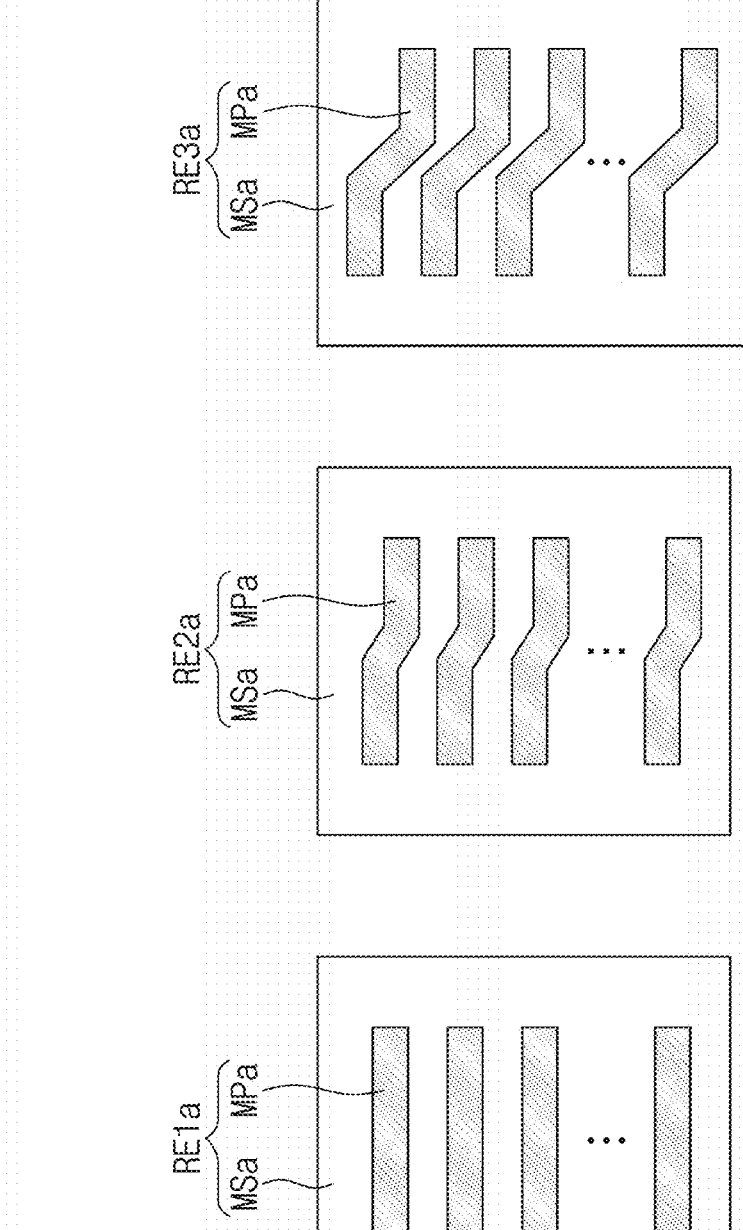
FIG. 19 illustrates a plan view showing a method of selecting a first reticle according to some example embodiments.

FIG. 19 illustrates a plan view showing a method of selecting a first reticle according to some example embodiments.

Referring to FIG. 19, a set of reticles RE1a, RE2a, and RE3a may be provided. The set of reticles RE1a, RE2a, and RE3a may include a first reticle RE1a, a second reticle RE2a, and a third reticle RE3a. In some example embodiments, the number of reticles may be two, four, or more.

Each of the first, second, and third reticles RE1a, RE2a, and RE3a may include a mask substrate MSa and a plurality of mask patterns MPa.

A first reticle may be selected based on the measured misalignment value of FIG. 16. When a certain one of the reticles RE1a, RE2a, and RE3a includes the mask pattern MP that corresponds to the measured second misalignment value, the certain one may be selected as a first reticle based on the measured second misalignment value.

Figure 20A:
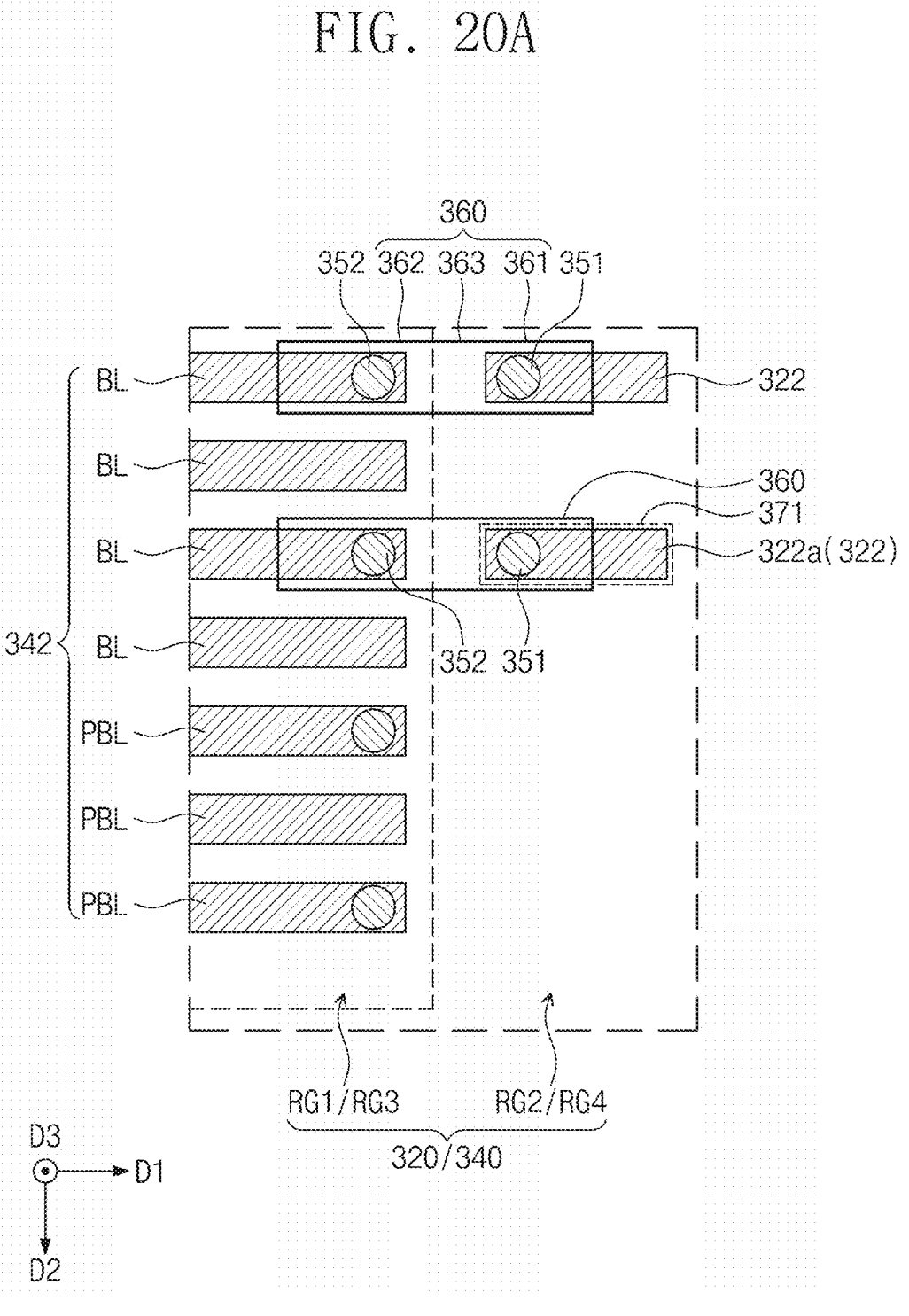
FIGS. 20A, 20B, and 20C illustrate plan views showing a method of forming a connection conductive structure of FIG. 18.
Figure 20B:
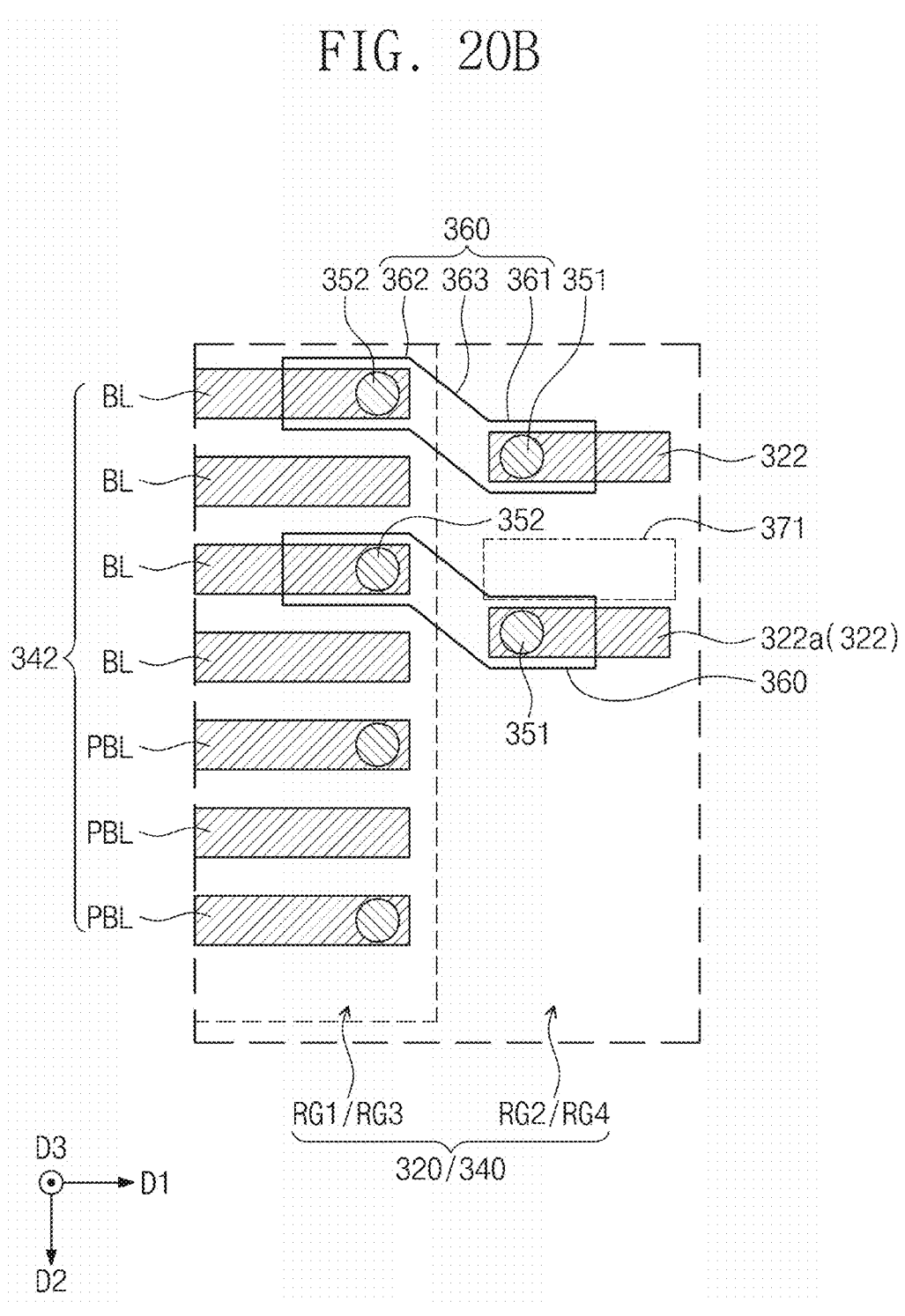
Figure 20C:
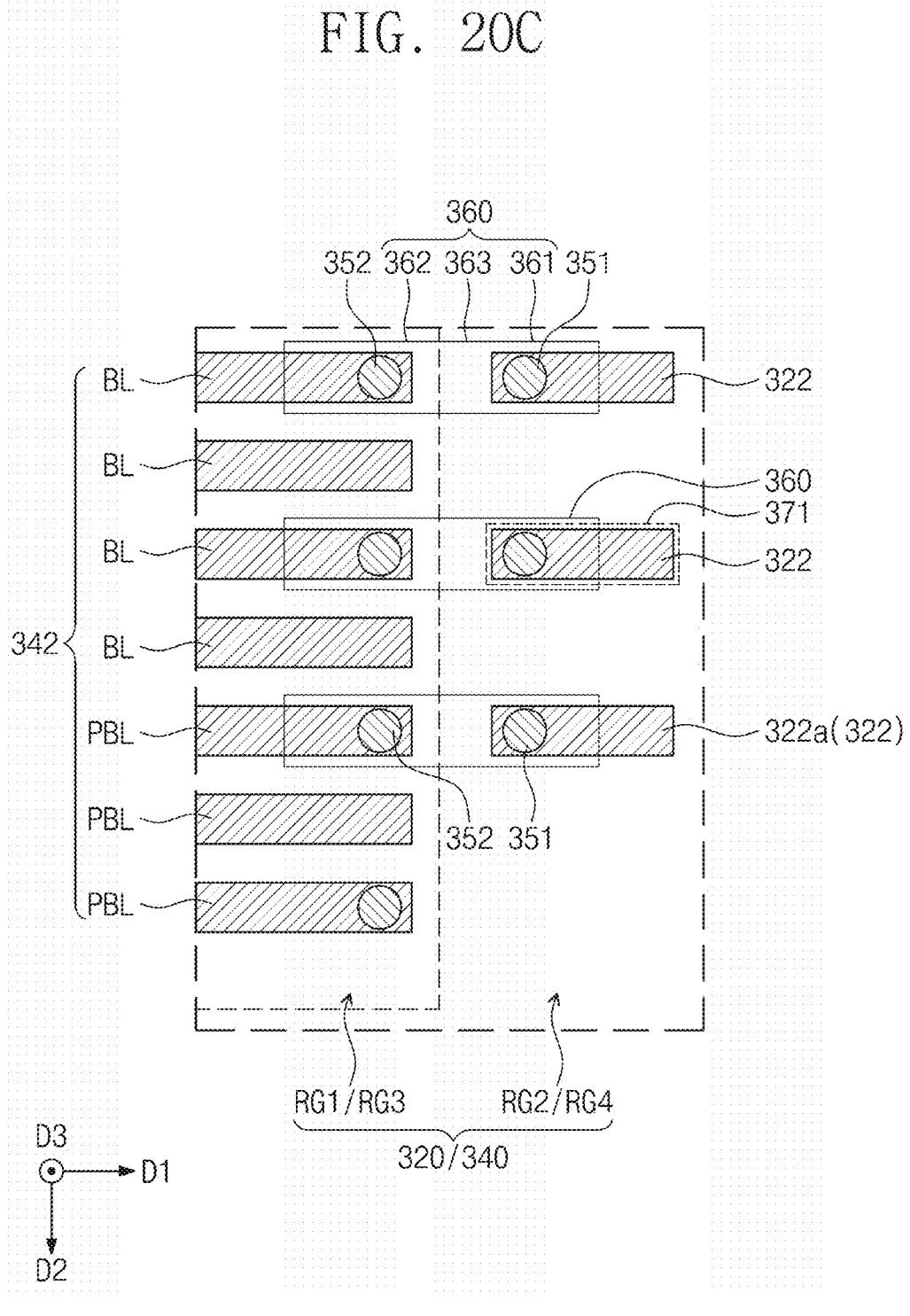

FIGS. 20A, 20B, and 20C illustrate plan views showing a method of forming a connection conductive structure of FIG. 18.

Referring to FIGS. 20A, 20B, and 20C, the second conductive structures 342 may include bit lines BL and preliminary bit lines PBL. The first conductive structures 322, the bit lines BL, and the preliminary bit lines PBL may extend in the first direction D1. The bit lines BL and the preliminary bit lines PBL may be arranged in the second direction D2. The first conductive structures 322 may be arranged in the second direction D2. A distance in the second direction D2 from the preliminary bit line PBL to the fourth region RG4 may be less than a distance in the second direction D2 from the bit line BL to the fourth region RG4. For example, when viewed in the second direction D2, the preliminary bit line PBL may be disposed closer than the bit line BL to the fourth region RG4.

The first conductive structures 322 may include a reference conductive structure 322a adjacent to the preliminary bit line PBL. There may be defined an alignment position 371 of the reference conductive structure 322a.

A first conductive contact 351 may be provided to connect to the first conductive structure 322. A second conductive contact 352 may be provided to connect to the second conductive structure 342. The second conductive contact 352 may be connected to each of odd-numbered second conductive structures 342. Even-numbered second conductive structures 342 may each be connected to a third conductive contact different from the second conductive contact 352. The even-numbered second conductive structure 342 may not be electrically connected to the first conductive structure 322.

The connection conductive structure 360 may include a first portion 361 that overlaps the first conductive contact 351 and the first conductive structure 322, a second portion 362 that overlaps the second conductive contact 352 and the second conductive structure 342, and a third portion 363 that connects to each other the first and second portions 361 and 362 of the connection conductive structure 360. The first and second portions 361 and 362 of the connection conductive structure 360 may extend in the first direction D1.

At least some, or an entirety of the first conductive contact 351 may overlap the first portion 361 of the connection conductive structure 360. In some example embodiments, a portion of the first conductive contact 351 may overlap the first portion 361 of the connection conductive structure 360. An entirety of the second conductive contact 352 may overlap the second portion 362 of the connection conductive structure 360. In some example embodiments, a portion of the second conductive contact 352 may overlap the second portion 362 of the connection conductive structure 360.

In some example embodiments, the connection conductive structures 360 may be formed to align with the first conductive structures 322, and each of the connection conductive structures 360 may be configured such that a length in the first direction D1 of the first portion 361 is greater than a length in the first direction D1 of the second portion 362.

Referring to FIG. 20A, the first and second bonding structures 320 and 340 may be bonded to each other to allow the reference conductive structure 322a to reside on the alignment position 371 of the reference conductive structure 322a. For example, no misalignment may be provided in the second direction D2 between the first and second bonding structures 320 and 340.

In this case, the connection conductive structure 360 may have a straight shape. The connection conductive structure 360 may have a bar or linear shape. The first, second, and third portions 361, 362, and 363 of the connection conductive structure 360 may extend in the first direction D1. Entireties of the first, second, and third portions 361, 362, and 363 of the connection conductive structure 360 may completely overlap in the first direction D1 with each other.

A connection opening may also have a straight shape to form the connection conductive structure 360 having a straight shape of FIG. 20A. A reticle including the mask pattern MPa having a straight shape may be selected as a first reticle to form the connection conductive structure 360 and the connection opening each of which has a straight shape.

Referring to FIG. 20B, the first and second bonding structures 320 and 340 may be bonded to each other to cause the reference conductive structure 322a to separate in the second direction D2 from the alignment position 371 of the reference conductive structure 322a. For example, a misalignment may occur in the second direction D2 between the first and second bonding structures 320 and 340. The second misalignment value between the first and second bonding structures 320 and 340 may be less than twice a pitch between the second conductive structures 342.

In this case, the third portion 363 of the connection conductive structure 360 may extend in a direction that intersects the first direction D1 and the second direction D2. The connection conductive structure 360 may have a shape in which a portion of the first portion 361 overlaps in the first direction D1 with a portion of the second portion 362 and/or the first portion 361 does not overlap with the second portion 362.

To form the connection conductive structure 360 having a shape of FIG. 20B, a connection opening may also have a shape similar to that of the connection conductive structure 360. To form the connection conductive structure 360 and the connection opening each of which has a shape of FIG. 20B, a reticle including the mask pattern MPa whose shape is similar to that of the connection structure 360 and the connection opening may be selected as a first reticle. As used herein, a first shape being "similar to" another second shape may indicate that the two shapes resemble each other, for example having a same polygonal layout as each other and/or a same number of angles as each other and/or being the same shape but different size as each other.

When the second misalignment value between the first and second bonding structures 320 and 340 is less than a predetermined value (e.g., less than twice a pitch between the second conductive structures 322), a first reticle may be selected to electrically connect the first conductive structures 322 to the bit lines BL.

Referring to FIG. 20C, the first and second bonding structures 320 and 340 may be bonded to each other to cause the reference conductive structure 322a to separate in the second direction D2 from the alignment position 371 of the reference conductive structure 322a. For example, a misalignment may occur in the second direction D2 between the first and second bonding structures 320 and 340. The second misalignment value between the first and second bonding structures 320 and 340 may be twice a pitch between the second conductive structures 342.

In this case, at least one of the connection conductive structures 360 may connect the first conductive structure 322 to the preliminary bit line PBL. For example, one of the connection conductive structures 360 may connect the reference conductive structure 322a to the preliminary bit line PBL. A straight shape may be given to the connection conductive structure 360 that electrically connects the reference conductive structure 322a to the preliminary bit line PBL.

When the second misalignment value between the first and second bonding structures 320 and 340 is equal to or greater than a predetermined value (e.g., equal to or greater than twice a pitch between the second conductive structures 322), a first reticle may be selected to electrically connect at least one of the first conductive structures 322 to the preliminary bit line PBL. Therefore, it may be possible to increase a range of tolerable misalignment capable of being compensated even when a limitation is imposed on a set of reticles. An increase in the number of the preliminary bit lines PBL may increase a compensation range of misalignment in the second direction D2.

In some example embodiments, the second conductive structures 342 and the first conductive structures 322 may be disposed at the same pitch, and the second conductive structures 342 that are continuously disposed may be correspondingly connected to the first conductive structures 322 that are continuously disposed. In this case, when the second misalignment value is equal to or greater than a pitch between the second conductive structures 342, a first reticle may be selected to allow at least one of the first conductive structures 322 to connect to the preliminary bit line PBL.

A method of fabricating a semiconductor device according to, some example embodiments of the present inventive concepts may include selecting a first reticle from a set of reticles, and thus it may be possible to compensate a misalignment between conductive structures.

Although various example embodiments of inventive concepts have been discussed with reference to accompanying figures, it will be understood that various changes in form and details may be made therein without departing from the spirit and scope of inventive concepts. It therefore will be understood that example embodiments described above are just illustrative but not limitative in all aspects. Furthermore, example embodiments are not necessarily mutually exclusive with one another. For example, some example embodiments may include one or more features described with reference to one or more figures, and may also include one or more features described with reference to one or more other figures.

What is claimed is:

1. A method of fabricating a semiconductor device, the method comprising:
forming a first conductive structure and a second conductive structure;
measuring a misalignment value between the first conductive structure and the second conductive structure;
based on the measured misalignment value, selecting a reticle from a set of reticles; and
using the selected reticle to form a connection conductive structure that electrically connects the first conductive structure to the second conductive structure.

2. The method of claim 1, further comprising:
forming a first conductive contact connected to the first conductive structure,
wherein the connection conductive structure is connected to the first conductive contact.

3. The method of claim 2, further comprising:
forming a second conductive contact connected to the second conductive structure,
wherein the connection conductive structure is connected to the second conductive contact.

4. The method of claim 3, wherein the connection conductive structure is in contact with a top surface of and a sidewall of the second conductive contact.

5. The method of claim 1, wherein
each reticle in the set of reticles includes a mask pattern, and
the selecting the selected reticle includes selecting a reticle that includes the mask pattern having a shape similar to a shape of the connection conductive structure.

6. The method of claim 1, wherein
the forming the connection conductive structure includes:
forming a photoresist layer on a dielectric structure that covers the first conductive structure and the second conductive structure;
patterning the photoresist layer using the selected reticle;
patterning the dielectric structure using the patterned photoresist layer, wherein a connection opening is defined on the patterned dielectric structure; and
forming the connection conductive structure in the connection opening.

7. The method of claim 1, wherein the connection conductive structure at least partially overlaps the first conductive structure and the second conductive structure.

8. The method of claim 1, wherein
the first conductive structure includes a main conductive structure and a preliminary conductive structure, and
wherein forming the connection conductive structure includes,
determining whether the measured misalignment value is less than a threshold value;
when the measured misalignment value is less than the threshold value, forming the connection conductive structure to electrically connect the main conductive structure to the second conductive structure; and
when the measured misalignment value is greater than or equal to the threshold value, forming the connection conductive structure to electrically connect the preliminary conductive structure to the second conductive structure.

9. A method of fabricating a semiconductor device, the method comprising:
forming a first conductive structure and a second conductive structure, the first conductive structure including a main conductive structure and a preliminary conductive structure;
measuring a misalignment value between the first conductive structure and the second conductive structure;
determining whether the measured misalignment value is less than a threshold value;
in response to the measured misalignment value being less than the threshold value, forming a connection conductive structure to electrically connect the main conductive structure to the second conductive structure; and
in response to the measured misalignment value being greater than or equal to the threshold value, forming the connection conductive structure to electrically connect the preliminary conductive structure to the second conductive structure.

10. The method of claim 9, wherein the forming the connection conductive structure includes:

based on the measured misalignment value, selecting a reticle from a set of reticles; and using the selected reticle to form the connection conductive structure.

11. The method of claim 10, wherein each reticle in the set of reticles includes a mask pattern, and the selecting the selected reticle includes selecting a reticle that includes the mask pattern having a shape similar to a shape of the connection conductive structure.

12. The method of claim 9, wherein the main conductive structure, the preliminary conductive structure, and the second conductive structure extend in a first direction, the main conductive structure and the preliminary conductive structure are arranged in a second direction that intersects the first direction, and the measured misalignment value is a value of misalignment in the second direction.

13. The method of claim 9, further comprising:

forming a first conductive contact connected to the first conductive structure and a second conductive contact connected to the second conductive structure, wherein the connection conductive structure at least partially overlaps a portion of the first conductive contact.

14. The method of claim 13, wherein the connection conductive structure at least partially overlaps a portion of the second conductive contact.

15. A method of fabricating a semiconductor device, the method comprising:

forming a first conductive structure and a second conductive structure; and forming a connection conductive structure to align with a position of the first conductive structure, wherein the connection conductive structure electrically connects the first conductive structure to the second conductive structure, the first conductive structure includes a first adjacent sidewall adjacent to the second conductive structure, the second conductive structure includes a second adjacent sidewall adjacent to the first conductive structure, the connection conductive structure includes a first portion that at least partially overlaps the first conductive structure and a second portion that at least partially overlaps the second conductive structure, the first portion of the connection conductive structure includes a first outer sidewall that is farthest from the second portion of the connection conductive structure, the second portion of the connection conductive structure includes a second outer sidewall that is farthest from the first portion of the connection conductive structure, and a distance between the first adjacent sidewall of the first conductive structure and the first outer sidewall of the first portion of the connection conductive structure is less than a distance between the second adjacent sidewall of the second conductive structure and the second outer sidewall of the second portion of the connection conductive structure.

16. The method of claim 15, wherein the connection conductive structure includes:

a third portion that connects to each other the first portion and the second portion of the connection conductive structure;

a first boundary between the first portion and the third portion of the connection conductive structure; and a second boundary between the second portion and the third portion of the connection conductive structure.

17. The method of claim 16, wherein a distance between the first adjacent sidewall of the first conductive structure and the first boundary of the connection conductive structure is less than a distance between the second adjacent sidewall of the second conductive structure and the second boundary of the connection conductive structure.

18. The method of claim 16, further comprising:

forming a first conductive contact connected to the first conductive structure and a second conductive contact connected to the second conductive structure, wherein a distance between the first conductive contact and the first boundary of the connection conductive structure is less than a distance between the second conductive contact and the second boundary of the connection conductive structure.

19. The method of claim 15, further comprising:

forming a first conductive contact connected to the first conductive structure and a second conductive contact connected to the second conductive structure, wherein a distance between the first conductive contact and the first outer sidewall of the first portion of the connection conductive structure is less than a distance between the second conductive contact and the second outer sidewall of the second portion of the connection conductive structure.

20. The method of claim 15, wherein a length of the first portion of the connection conductive structure is less than a length of the second portion of the connection conductive structure.

* * * * *